United States Patent
Oyama et al.

(10) Patent No.: US 11,422,194 B2
(45) Date of Patent: Aug. 23, 2022

(54) BATTERY DIAGNOSIS APPARATUS AND BATTERY DIAGNOSIS METHOD BASED ON CURRENT PULSE METHOD

(71) Applicant: EnNet Company Limited, Tokyo (JP)

(72) Inventors: Noboru Oyama, Musashino (JP); Shuichiro Yamaguchi, Musashino (JP); Rin Furudate, Musashino (JP)

(73) Assignee: ENNET COMPANY LIMITED, Musashino (JP)

( * ) Notice: Subject to any disclaimer, the term of this patent is extended or adjusted under 35 U.S.C. 154(b) by 0 days.

(21) Appl. No.: 17/290,346

(22) PCT Filed: Jun. 4, 2019

(86) PCT No.: PCT/JP2019/022129
§ 371 (c)(1),
(2) Date: Apr. 30, 2021

(87) PCT Pub. No.: WO2020/090143
PCT Pub. Date: May 7, 2020

(65) Prior Publication Data
US 2021/0382114 A1 Dec. 9, 2021

(30) Foreign Application Priority Data
Oct. 30, 2018 (JP) .............................. JP2018-204492

(51) Int. Cl.
*G01R 31/367* (2019.01)
*G01R 31/392* (2019.01)
(Continued)

(52) U.S. Cl.
CPC ......... *G01R 31/367* (2019.01); *G01R 31/378* (2019.01); *G01R 31/388* (2019.01); *G01R 31/392* (2019.01)

(58) Field of Classification Search
CPC .. G01R 31/367; G01R 31/392; G01R 31/388; G01R 31/378
See application file for complete search history.

(56) References Cited

U.S. PATENT DOCUMENTS 6,118,275 A 9/2000 Yoon et al.
9,989,595 B1 * 6/2018 Wang ................. G01R 31/3648
(Continued)

FOREIGN PATENT DOCUMENTS

| JP | 2000-019234 A | 1/2000 |
| JP | 6145824 B2 | 6/2017 |
| WO | 2016/136788 A1 | 9/2016 |

OTHER PUBLICATIONS

Extended European Search Report dated Dec. 14, 2021 in Application No. 19878312.8.
(Continued)

*Primary Examiner* — Raymond L Nimox
(74) *Attorney, Agent, or Firm* — Sughrue Mion, PLLC

(57) ABSTRACT

A battery diagnosis apparatus and a battery diagnosis method for accurately diagnosing a secondary battery are proposed. A pulse current generator, a voltage measuring instrument that measures a voltage response to application of a current pulse, a first data processing device that obtains a chronopotentiogram (CP) indicating a change in the voltage response over time and normalizes the CP, a database that saves normalized data, and a second data processing device that uses a correlation between the saved data and a battery state expressing factor prepared in advance to make a battery diagnosis are used. Desirably, the current pulse is a current in the same direction at the time of data obtainment and at the time of a diagnosis. Further, a noise filter for an input signal of the CP and resampling means for reducing the number of pieces of data input to the first data processing device are provided.

11 Claims, 19 Drawing Sheets

(51) Int. Cl.
*G01R 31/388* (2019.01)
*G01R 31/378* (2019.01)

(56) References Cited

U.S. PATENT DOCUMENTS

| | | | | |
|---|---|---|---|---|
| 2003/0184307 | A1* | 10/2003 | Kozlowski | G01R 31/367 |
| | | | | 324/427 |
| 2003/0206021 | A1 | 11/2003 | Laletin et al. | |
| 2004/0095143 | A1 | 5/2004 | Laig-Hoerstebrock et al. | |
| 2004/0158418 | A1* | 8/2004 | Kato | G01R 31/3835 |
| | | | | 702/63 |
| 2012/0310565 | A1* | 12/2012 | Redey | G01R 31/392 |
| | | | | 702/63 |
| 2013/0069660 | A1* | 3/2013 | Bernard | G01R 31/367 |
| | | | | 324/430 |
| 2018/0038918 | A1 | 2/2018 | Nagaoka et al. | |
| 2018/0149708 | A1* | 5/2018 | Shoa | G01R 31/392 |
| 2018/0275200 | A1* | 9/2018 | Chung | G01R 31/386 |

OTHER PUBLICATIONS

English Translation of International Preliminary Report on Patentability dated Sep. 16, 2020 in Application No. PCT/JP2019/022129 (translation issued on Mar. 1, 2021).

Noboru Oyama, et al., "Evaluation of Thermodynamic and Kinetic Parameters from Voltammetric Responses for Molecular-Solid $Li(Li_{1/3}Ti_{5/3})O_4$ Particles Confined on Electrode", Journal of the Electrochemical Society, 2013, pp. A3206-A3212, vol. 160, No. 5.

Noboru Oyama, et al., "Analysis for Voltammetric Responses of Molecular-Solid Tetrathionaphthalene Confined on an Electrode", Analytical Chemistry, 2011, pp. 8429-8438, vol. 83.

International Search Report for PCT/JP2019/022129 dated Jul. 30, 2019 [PCT/ISA/210].

* cited by examiner

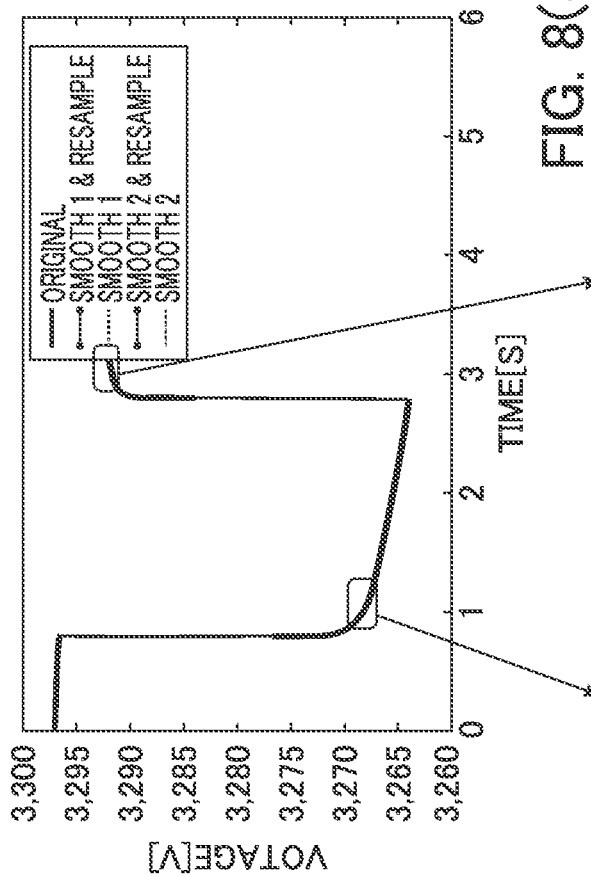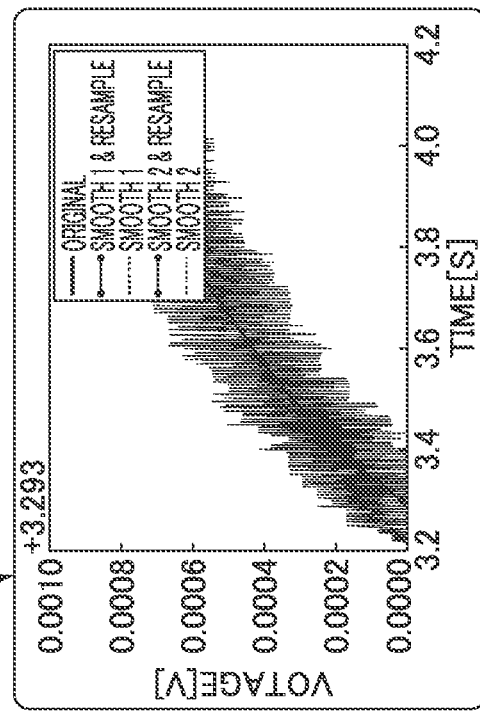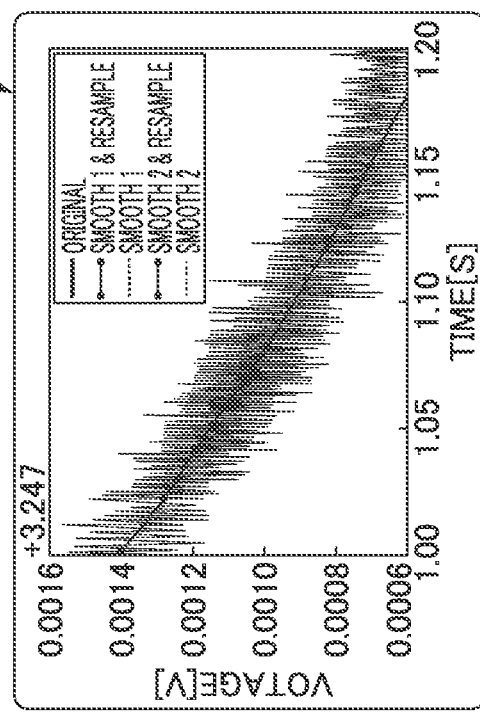

FIG. 11

| T(°C) | SOC(%) | | | | | | | | | | | | | | | | | | | | |
|---|---|---|---|---|---|---|---|---|---|---|---|---|---|---|---|---|---|---|---|---|---|
| | 0 | 5 | 10 | 15 | 20 | 25 | 30 | 35 | 40 | 45 | 50 | 55 | 60 | 65 | 70 | 75 | 80 | 85 | 90 | 95 | 100 |
| -25 | | | | | | | | | | | | | | | | | | | | | |
| -20 | | | | | | | | | | | | | | | | | | | | | |
| -15 | | | | | | | | | | | | | | | | | | | | | |
| -10 | | | | | | | | | | | | | | | | | | | | | |
| -5 | | | | | | | | | | | | | | | | | | | | | |
| 0 | | | | | | | | | | | | | | | | | | | | | |
| 5 | | | | | | | | | | | | | | | | | | | | | |
| 10 | | | | | | | | | | | | | | | | | | | | | |
| 15 | | | | | | | | | | | | | | | | | | | | | |
| 20 | | | | | | | | | | | | | | | | | | | | | |
| 25 | | | | | | | | | | | | | | | | | | | | | |
| 30 | | | | | | | | | | | | | | | | | | | | | |
| 35 | | | | | | | | | | | | | | | | | | | | | |
| 40 | | | | | | | | | | | | | | | | | | | | | |
| 45 | | | | | | | | | | | | | | | | | | | | | |
| 50 | | | | | | | | | | | | | | | | | | | | | |
| 55 | | | | | | | | | | | | | | | | | | | | | |
| 60 | | | | | | | | | | | | | | | | | | | | | |
| 80 | | | | | | | | | | | | | | | | | | | | | |

BATTERY DIAGNOSIS APPARATUS AND BATTERY DIAGNOSIS METHOD BASED ON CURRENT PULSE METHOD

CROSS REFERENCE TO RELATED APPLICATIONS

This application is a National Stage of International Application No. PCT/JP2019/022129 filed Jun. 4, 2019, claiming priority based on Japanese Patent Application No. 2018-204492 filed Oct. 30, 2018.

TECHNICAL FIELD

The present invention relates to a battery diagnosis apparatus and a battery diagnosis method based on a current pulse method for making a battery state diagnosis including degradation determination, temperature determination, and the state of charge, for example, lithium-ion batteries (LIBs).

BACKGROUND ART

Highly efficient lithium-ion batteries, which are expected to be promising energy storage means, are being increasingly used in the markets of, for example, electric vehicles and stationary power supplies as large- or medium-sized power supplies, in connection with the issue of realizing a low-carbon society. LIBs manufactured by battery manufacturers are not the same, and differ in component materials, size, external form, capacity, and output voltage and also differ in degree of degradation progression, length of life, and safety depending on the use condition and environment of the battery.

Currently, in a degradation diagnosis widely made for ordinary batteries, a technique is used in which an evaluation is made on the basis of an increase in the internal resistance of the single battery or the entire assembled battery. To evaluate the SOH (State of Health: degree of health) and the SOC (State of Charge: charge state) of a battery, a direct-current method is used in which output voltage measurement and a current integration method are used respectively. These techniques are very effective diagnosis methods for lead-acid batteries. However, it is known that the techniques are not correct methods for LIBs because LIBs differ from lead-acid batteries in operation principle and component materials.

Here, the SOH is an indicator of the state or health degradation state of a battery. In general, examples of the measures of degradation of a battery include a decrease in full charge capacity and an increase in resistance. Therefore, it is known that as the definition of SOH, the rate of the current full charge capacity to decrease from the initial full charge capacity indicates the degradation state (capacity retention rate), or the rate of change from the initial resistance indicates the degradation state (resistance increase rate).

For convenience sake, it is assumed below that the SOH indicates the capacity retention rate. That is, the SOH is an indicator of the rate of decrease in capacity, is the capacity retention rate, and indicates a value, namely, the full charge capacity at a certain time point during use ÷ the initial full charge capacity, as a percentage.

Here, regarding the capacity retention rate, the capacity may indicate the amount of charge (in units of Ah) or may indicate the amount of work (in units of Wh). For convenience sake, it is assumed in the description given below that the capacity indicates the amount of charge.

In a case where the resistance increase rate is used as the definition, the resistance may be the alternating-current resistance or the direct-current resistance. Therefore, in this case, attention needs to be paid.

It is known that in a case where the SOH is actually measured, a large number of parameters including the test temperature, the applied current value, and the SOC, etc. (for example, the current passing time in a case of measurement of the direct-current resistance) need to be taken into consideration, and it is required to optimize the test conditions.

The SOC (State of Charge) is an indicator of the charge state. Full charge is defined as 100% and full discharge is defined as 0%. In general, as the definition of SOC, the full charge state is assumed to be 100%, and a current that flows during discharge is integrated to obtain the SOC. In a case where the SOC is to be measured in a simplified manner, it is understood that the SOC can be roughly calculated by measuring the voltage of the battery and checking the voltage against an SOC-OCV (open circuit voltage) curve.

For information, a procedure of an existing safety evaluation and a management technique for secondary batteries is illustrated in Table 1 below.

TABLE 1

Procedure of existing safety evaluation and management technique for secondary batteries 1. Measure the output voltage (OCV) in an open circuit state.
2. Apply a test current and measure a response of the output potential.
3. Evaluate the SOC from the integral of the used current.
4. Apply a sinusoidal wave at a fixed frequency (1 kHz) and measure the impedance response.
5. Measure the temperature during an operation.
6. Estimate the SOC using a Kalman filter (from a response of OCV).

A diagnostic instrument is commercially available that can be used in an evaluation of lead-acid batteries and in which a diagnosis based on measurement of the direct-current resistance value as illustrated in Table 1 above is made or in which a degradation diagnosis method in which the diagnosis and the impedance value at 1 kHz described in 4 in Table 1 are combined is used. However, in a case where this diagnostic instrument is applied to an LIB diagnosis, the precision of diagnosis is not satisfactory. The reasons are that, in a case of LIBs, the resistance value may change little even when the battery is degraded and the capacity decreases and that the value of the impedance characteristic obtained in a frequency range of 1 kHz mainly reflects a change in the resistance of the electrolyte in the battery and might not reflect a change in the characteristics of an electrode, such as the positive electrode or the negative electrode. That is, the resistance value of the positive electrode or the negative electrode of LIBs generally has a value that is an order of magnitude smaller than the resistance value of the electrolyte, and therefore, it is difficult to observe a change in the resistance value caused by degradation of the electrode. It is often the case that in a case where a change in the resistance value of the electrolyte is observed, the battery has been degraded to a substantially large degree.

Unlike in a case of lead-acid batteries, in a case of, for example, commercially available LIBs, the LIBs are different batteries that differ in, for example, component materials, form, and capacity depending on the manufacturer, and it is not possible to measure the degrees of degradation of various LIBs with a commercially available diagnostic instrument, such as testers for measuring the voltage, current, and resistance. That is, a diagnostic instrument for LIBs is required to include a diagnostic algorithm for each type of LIB. In general, the electrical characteristics of a battery reflect some phenomena of an electrochemical reaction inside the battery, and therefore, depend on the temperature during an operation to a large degree. Accordingly, the temperature needs to be corrected.

Further, as described above, in a degradation evaluation of secondary batteries including LIBs, a direct-current method is used in which, for example, the output voltage value is measured (that is, a change in the internal resistance is observed), and a large number of techniques are based on measurement of three state diagnosis parameters of voltage, current, and temperature. Among these techniques, a technique is available in which a discharge pulse of a constant current is applied to a battery in seconds to determine degradation of the battery from the voltage drop characteristics. In this case, the degradation state can be grasped on a per cell basis.

As a direct-current method similar to the above-described technique, a technique is available in which the current in a secondary battery that is being charged or discharged is interrupted for several tens of seconds and the state of the battery is determined from a change in the terminal voltage at that time (voltage vs. interruption period).

However, in a case of LIBs, correlations, such as the proportionality between a change in the output voltage obtained with the above-described techniques and the SOC or SOH, are not satisfactorily grasped. One of the major reasons is that a hysteresis phenomenon specific to a solid state reaction in a battery reaction occurs in the output potential of LIBs. That is, this is a hysteresis phenomenon in which even in a case where the SOC is the same, a potential difference of several tens of millivolts (mV) arises per LIB depending on the current operating direction after a charge process or a discharge process.

In general, a transient response to a direct-current pulse includes a factor of the hysteresis phenomenon, but a diagnosis method that takes into consideration the phenomenon has not been disclosed or made public. That is, a highly accurate diagnosis method that takes into consideration the phenomenon has not been available to date. For example, even in a case of a diagnosis based on a Kalman method for onboard use, which is considered to be a diagnosis method using advanced technology, it is often the case that a change in the output voltage is monitored as is and is used as time-series data, the hysteresis phenomenon is not taken into consideration, and therefore, improvement in the accuracy of evaluation of the SOC or SOH of batteries is not achieved.

The characteristics of LIBs are generally expressed by charge and discharge curves, and there may be a case where the full charge capacity gradually decreases as the characteristics of the component materials inside the battery change over time and a case where the full charge capacity suddenly and significantly changes when degradation occurs, the life cycle ends, and thus the battery becomes not usable any more. Further, although very rare, sudden heat generation or ignition may occur. It is difficult to determine a state of degradation from the external appearance, such as deformation of the battery, and effective means is not available currently.

Currently, as markers for determining battery states, such as the degradation state and the charge state, for example, (A) a change in the internal resistance caused by application of a current or a voltage pulse, (B) a change in the open circuit voltage and in the output voltage during an operation, and (C) observation of a sudden temperature rise during an operation are used (see Table 2). Here, as measures for expressing the degree of degradation (degradation state) of a battery, the amount of change in the open circuit voltage per unit electricity amount discharge and a change in the open circuit voltage value in the full charge state are often used. The ratio of (full charge capacity÷initial full charge capacity) has been considered to be an indicator that indicates the degradation state as a parameter indicating the degree of health or the degree of degradation (that is, SOH) of the battery. Further, for example, a decrease in the power density (State of Power: SOP) also serves as the indicator.

To measure a decrease in the full charge capacity that is associated with the degree of degradation of the LIB, there is no technique except a method of checking the charge-discharge characteristics at a low rate that requires a long time (for example, this takes about 20 hours or more at a 0.1 C rate), and no simple technique is currently available.

A currently available evaluation method for LIBs is illustrated in Table 2. Note that this method is not yet satisfactory, and some issues need to be addressed. These common issues are described below, and solutions for the issues are summarized.

TABLE 2

Existing method for evaluating battery characteristics, namely, degree of degradation (SOH) and charge state (SOC)

1. A change in the output voltage
2. A change in the measurement temperature
3. A change in the direct-current internal resistance
4. A transient response to application of a current or a voltage pulse (including a transient response by an open circuit)
5. A change in the impedance value at a fixed frequency
6. A change in the ratio of (change in open circuit voltage)/(unit discharge electricity amount)
7. A change in the difference voltage between the upper charge voltage and a voltage after an elapse of several tens of seconds since the start of discharge
8. A change in the ratio of (full charge capacity)/(initial full charge capacity) (which is assumed to be the SOH)

It is known that in nickel-cadmium batteries or nickel-hydrogen batteries, a phenomenon called a memory effect occurs depending on the charge-discharge conditions. This is a phenomenon in which, for example, repeated recharging of batteries after partial discharge reduces the operation times of devices using the batteries. To eliminate such a memory effect, it is required to repeat with sufficient depth of discharge and charge.

On the other hand, it is not reported that the memory effect occurs in LIBs. However, as a result of careful observation of LIBs, the observed output voltage changes by several tens of millivolts per cell depending on the current operating direction, and this potential difference is not a negligible value.

Regarding the effect of the potential hysteresis phenomenon specific to LIBs, in the output potentials of LIBs illustrated in Table 3, which are generally used inside and outside the country, the hysteresis phenomenon specific to a solid state reaction in a battery reaction (see FIG. 4(a), FIG. 4(b), FIG. 4(c), FIG. 4(d), FIG. 4(e), FIG. 4(f), and FIG. 4(g)) occurs, that is, even when the SOC is in the same state, a potential difference of several tens of millivolts (mV) arises depending on the control direction after a charge process or a discharge process, and this factor is involved in a transient response to a direct-current pulse (NPL 1).

In a case of LIBs, the value of the output voltage differs depending on a difference in the component materials of the battery and the charge or discharge direction of the battery operation immediately before potential measurement. That is, even when the SOC is in the same state, a potential difference of several tens of millivolts (mV) arises per LIB depending on the control direction after a charge process or a discharge process, and this factor is involved in a transient response to a direct-current pulse. Therefore, improvement of the diagnosis accuracy is not expected unless the phenomenon is taken into consideration. Accordingly, for the present pulse method, experimental conditions and a verification method for minimizing the effect of the hysteresis phenomenon are devised and employed in the present proposal. For this, experimental conditions for reducing the effect of a thermal change caused by application of a pulse current are employed.

reaction caused by application of a constant-current pulse, and therefore, it is desirable to devise a battery diagnosis apparatus and a battery diagnosis method that can also reduce this effect.

CITATION LIST

Patent Literature

PTL 1: Japanese Patent No. 6145824

Non Patent Literature

NPL 1: N. Oyama and S. Yamaguchi, J. Electrochem. Soc., 160, A3206-A3212 (2013)
NPL 2: Anal. Chem., 83, 8429-8438 (2011)

TABLE 3

| Sample cell No. | | Cell 1 | Cell 2 | Cell 3 | Cell 4 | Cell 5 | Cell 6 | Cell 7 |
|---|---|---|---|---|---|---|---|---|
| Type | | Cylindrical type 18650 | Cylindrical type 26650 | Large rectangular type | Cylindrical type 20700 | Medium rectangular type | Laminated type | Small rectangular type |
| Manufacturer | | Korea | Company S, Japan | Company P, Japan | Company P, Japan | Company T, Japan | Company A, Japan | China |
| Dimensions | | Ø18 × 65 | Ø26 × 65 | — | Ø20 × 70 | 62 × 13 × 94 | — | 25 × 23 × 5 |
| Capacity | | 2200 mAh | 3000 mAh | 28 Ah | 4000 mAh | 3 and 20 Ah | 4.8 Ah | 240 mAh |
| Rated voltage | | 3.6 V | 3.4 V | 3.7 V | 3.6 V | 2.2 V | 3.7 V | 3.7 V |
| Remarks | Negative electrode | Graphite | Graphite | Graphite | Graphite | LTO | Hard carbon | Graphite |
| | Positive electrode | NMC ternary compounds | Olivine iron | NMC ternary compounds | NMC ternary compounds | Spinel MN-containing ternary compounds | Spinel Mn | Ternary compounds |
| | Electrolyte | Liquid | Liquid | Liquid | Liquid | Liquid | Liquid | Polymer gel |

Table 3 illustrates the summary of the performances of various LIBs that are targets for evaluating the state diagnosis in the present invention. Sample cell numbers (1) to (7) respectively indicate a Korean 18650 type, a Japanese 26650 type from company S, a Japanese rectangular type from company P, a Japanese 20700 type from company P, a Japanese rectangular type from company T, a Japanese laminated rectangular type from company A, and a Chinese laminated rectangular type.

FIG. 4(a), FIG. 4(b), FIG. 4(c), FIG. 4(d), FIG. 4(e), FIG. 4(f), and FIG. 4(g) illustrate examples of the hysteresis phenomenon observed in LIBs, which are the charge-discharge characteristics of the various general-purpose LIBs illustrated in Table 3 at a low rate (a constant current at a 0.1 C rate (CC mode) and a CV mode) and at a measurement environment temperature of 25.0° C.
The hysteresis phenomenon causes the following problems in a battery diagnosis.

That is, even when the SOC is in the same state in an LIB, a potential difference arises depending on the control direction that differs depending on whether the diagnosis is made after a charge process or after a discharge process, and this factor is generally involved in a transient response to a constant-current pulse. This potential difference is not a negligible value relative to a change in the output voltage, and improvement of the diagnosis accuracy is not expected unless the phenomenon is taken into consideration. The hysteresis phenomenon is also obviously involved in alternating-current impedance measurement but is not taken into consideration.

Accordingly, one of the points of the present invention is to minimize the effect of the hysteresis phenomenon. Here, a temperature change occurs due to heat generation and heat absorption, which may have an effect on the electrode

SUMMARY OF INVENTION

Technical Problem

Currently, an expression of, for example, a Nyquist plot obtained by converting direct-current pulse transient response data to an impedance behavior has a non-negligible difference from a Nyquist plot directly obtained from an alternating-current impedance measured for the same battery under measurement conditions of the same environment, and the results of experiments often did not match. The causes of this difference are inferred as follows. In the results obtained by using the direct-current method and in the results obtained by using the alternating-current impedance method, observation data itself includes an error, or changes in various parameter values of a pseudo equivalent circuit used as the evaluation technique are not correctly grasped. That is, it is inferred that the degrees of degradation of batteries are not correctly diagnosed by the existing direct-current pulse method or alternating-current impedance method.

Accordingly, an object is to realize a battery diagnosis apparatus and a battery diagnosis method based on a current pulse method for making diagnoses of secondary batteries more accurately than before.

Solution to Problem

A battery diagnosis apparatus based on a current pulse method according to the present invention includes:
a pulse current generator that applies a single current pulse to a secondary battery that is a measurement target;

a voltage measuring instrument that measures a voltage response made in response to application of the single current pulse;

a first data processing device that obtains a chronopotentiogram indicating a change in the voltage response over time and performs normalization of the chronopotentiogram; and a second data processing device that receives data of the normalized chronopotentiogram, in which the second data processing device makes a battery diagnosis by using a correlation between normalized data regarding a secondary battery for extracting a battery state expressing factor, the normalized data being prepared in advance, and a battery state expressing factor.

For information, the current pulse that can be handled most easily in terms of analysis is a constant-current pulse.

Further, a battery diagnosis apparatus based on a current pulse method according to the present invention includes:

a pulse current generator that applies a current pulse formed of a plurality of current pulses to a secondary battery that is a measurement target;

a voltage measuring instrument that measures a voltage response made in response to application of the current pulse;

a first data processing device that obtains a chronopotentiogram indicating a change in the voltage response over time and performs normalization of the chronopotentiogram; and a second data processing device that receives data of the normalized chronopotentiogram, in which the second data processing device makes a battery diagnosis by using a correlation between normalized data regarding a secondary battery for extracting a battery state expressing factor, the normalized data being prepared in advance, and a battery state expressing factor.

Here, one current pulse waveform can be approximately handled as a plurality of successive constant-current pulses.

Note that in determination of a life (SOL) using these battery diagnosis apparatuses, predetermined SOH values of various LIBs may be assumed to be the life values, and a remainder of the life may be determined. Further, it is desirable that the second data processing device be a device in which a diagnostic algorithm that is subjected to machine learning of the correlation is installed. As the first data processing device and the second data processing device, the same data processing device may be used.

Further, the current pulse is a current pulse that is in a charge direction of the secondary battery, has a current value that changes from a predetermined current value including zero to a predetermined constant current value, and is thereafter interrupted.

Further, the current pulse is a current pulse that is in a discharge direction of the secondary battery, has a current value that changes from a predetermined current value including zero to a predetermined constant current value, and is thereafter interrupted.

Further, the battery state expressing factor is extracted from chronopotentiogram data that includes a state of health or a state of charge of the secondary battery for extracting a battery state expressing factor or a temperature of the secondary battery that is a measurement target, by using an apparatus having a configuration similar to a configuration of the battery diagnosis apparatus.

Further, the battery diagnosis apparatus based on a current pulse method further includes: a noise filter that reduces noise in an input signal of the voltage measuring instrument; and data resampling means for reducing the number of pieces of data input to the first data processing device.

Further, in the second data processing device, a diagnostic algorithm is installed, the diagnostic algorithm being subjected to machine learning of the correlation regarding the battery state expressing factor including a state of health, a state of charge, and a temperature of the secondary battery that is a measurement target, and the second data processing device makes a diagnosis regarding the state of health, the state of charge, or the temperature of the secondary battery that is a measurement target.

Further, a battery diagnosis method based on a current pulse method according to the present invention is a battery diagnosis method using a current pulse, in which in extraction of a battery state expressing factor, for an operation including (A1) a step of measuring the battery state expressing factor, and (A2) a step of applying a predetermined current pulse to a secondary battery for extracting a battery state expressing factor, measuring a change in a response voltage over time obtained in response to the applying by using a voltage measuring instrument, and normalizing a series of pieces of data of a chronopotentiogram that is a result of the measuring, (A3) for a plurality of secondary batteries having different battery state expressing factors, correlations between the plurality of normalized pieces of data obtained by performing the operation including the step of A1 and the step of A2 and the plurality of battery state expressing factors are extracted, and in a battery diagnosis, (B1) a current pulse is applied to a secondary battery that is a measurement target, (B2) a chronopotentiogram that indicates a change in a voltage response over time made in response to application of the current pulse is obtained, (B3) the chronopotentiogram is normalized, and (B4) the correlations are applied to data of the normalized chronopotentiogram to estimate a battery state expressing factor.

In the battery diagnosis, a battery diagnosis apparatus based on a current pulse method among the above-described battery diagnosis apparatuses based on a current pulse method can be used.

Here, it is not necessarily required to use the same battery or a battery of the same type at the time of data obtainment and at the time of a battery diagnosis. The correlation that is obtained from a battery of a type different from the type of the battery diagnosis target can be used to make a battery diagnosis as long as a diagnosis result having an error that is within an allowable range is obtained from the battery diagnosis. In a case where this is allowed, a workload for obtaining data can be reduced.

Advantageous Effects of Invention

With the battery diagnosis apparatus or the battery diagnosis method according to the present invention, a diagnosis of a battery including determination of degradation can be made with high accuracy in a short time.

BRIEF DESCRIPTION OF DRAWINGS

FIG. 4(a), FIG. 4(b), FIG. 4(c), FIG. 4(d), FIG. 4(e), FIG. 4(f), and FIG. 4(g) indicate pieces of measurement data of cell 1 to cell 7 respectively.

FIG. 8(a) is a diagram illustrating example resampling of measurement data, and resampling is performed so as to attain regular intervals for the logarithm of the time axis in this example. FIG. 8(b) and FIG. 8(c) are enlarged diagrams of the voltage drop portion and the voltage rise portion respectively.

FIG. 11 illustrates how a database regarding the dependence of ATRF(t) on the SOC and temperature is created and illustrates an example of creation of a file of respective degradation states (SOHs).

FIG. 14(a1), FIG. 14(b1), FIG. 14(c1), and FIG. 14(d1) in the upper rows illustrate the results of plotting (+signs) from actual measurement data obtained from measurement of an alternating-current impedance and fitting curves of the plots, and FIG. 14(a2), FIG. 14(b2), FIG. 14(c2), and FIG. 14(d2) in the lower rows illustrate simulation curves using parameter values obtained by an equivalent circuit analysis of ATRF(t) (pulse measurement conditions; current; 1.00 A, application time; 2.00 seconds).

DESCRIPTION OF EMBODIMENTS

Figure 1:
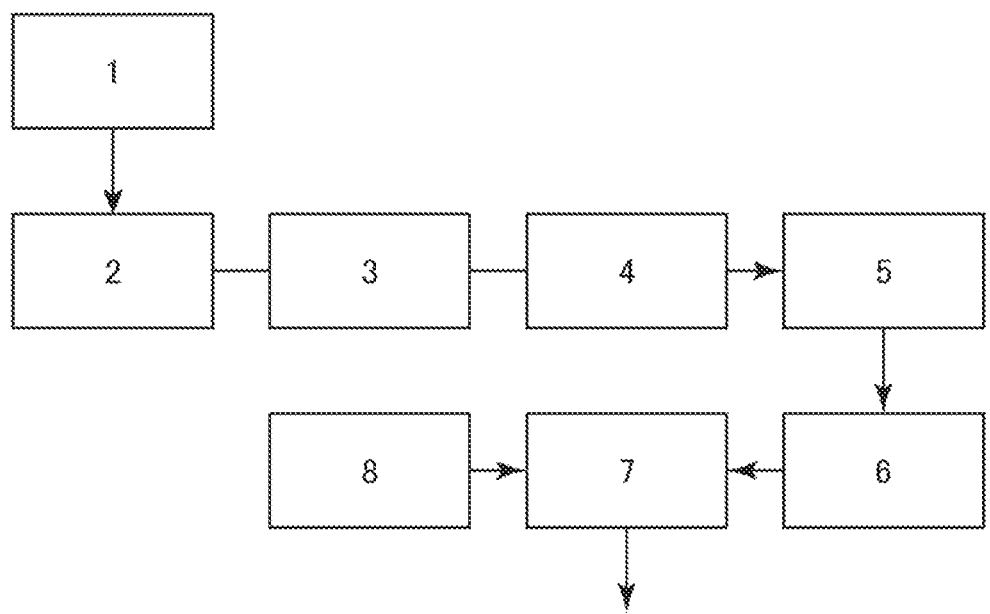
FIG. 1 is a block diagram illustrating an example configuration of a battery diagnosis apparatus based on a current pulse method according to the present invention.

FIG. 1 illustrates an example block diagram of a battery diagnosis apparatus that is assumed in the following description. For simplification of description, a constant-current pulse is mainly assumed below. In FIG. 1, a current pulse source 1 is a constant-current pulse generator for applying a constant-current pulse formed of a single pulse or a series of pulses including a plurality of pulses to a secondary battery, which is a test target battery 2. A response voltage to the application is measured by a voltmeter 4 at predetermined time intervals. To reduce noise in an input signal of the voltmeter 4, a noise filter 3 is used as necessary. It is assumed that output from the voltmeter 4 is digital output, and a digital filter 5 is used as necessary to reduce noise included in the digital output. The output from the digital filter 5 is input to a first data processor 6 that performs, for example, resampling, and output from the first data processor 6 is input to a second data processor 7. In the second data processor 7, an algorithm formula obtained by learning part of a database 8 that includes degradation data of secondary batteries prepared in advance and data extracted from the degradation data is installed, and the second data processor 7 is configured to diagnose a battery by using the algorithm formula and output the results.

Figure 2:
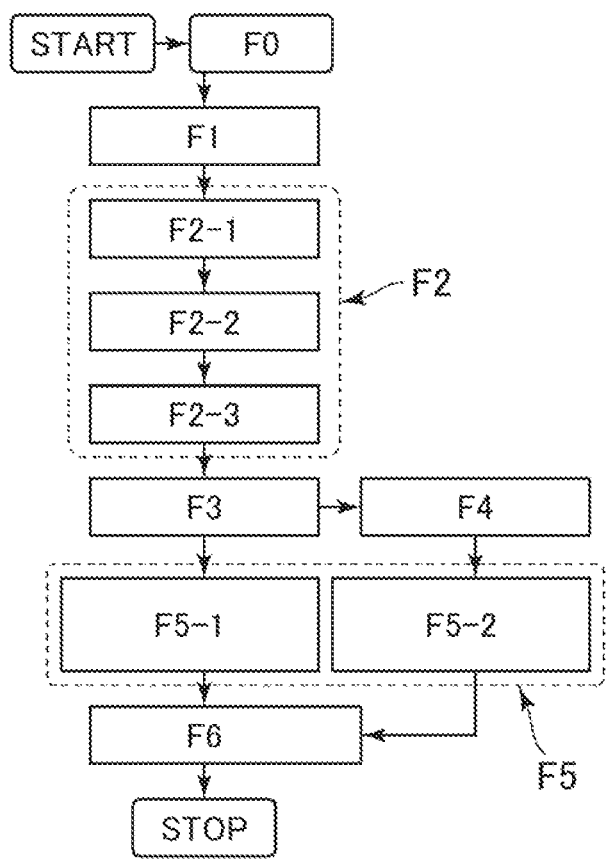
FIG. 2 is a flowchart of a battery diagnosis method based on a current pulse method according to the present invention.

FIG. 2 illustrates a flowchart of a battery diagnosis method that is assumed in the following description. FIG. 2 is a schematic diagram of the operations of the battery diagnosis apparatus and battery diagnosis method in which a transient response to the pulse of the present invention is expressed by a normalization function, and a diagnostic algorithm obtained by performing machine learning of correlations between values of the normalization function and battery state factors is devised to thereby enable an evaluation of the value of a battery state factor in a short time. The battery state factors are factors of SOH, temperature, SOC, SOP, and SOL. When the value of a single factor or the values of a plurality of factors are estimated, highly accurate estimation can be performed quickly.

In the steps in this flowchart, the following procedures are performed.

START: Start
F0: Test target battery
F1: Measure a transient response under optimum conditions of pulse application.
F2-1: Measure at the pulse application time (t=0) from measurement data.
F2-2: Smooth the measurement data for noise reduction.
F2-3: Compress the measurement data by data resampling.
F3: Calculate a normalization function (ATRF curve).
F4: Calculate equivalent circuit parameters.
F5-1: Estimate state factor value(s) (single factor or a plurality of factors) by using a diagnostic algorithm for ATRF.
F5-2: Estimate state factor value(s) (single factor or a plurality of factors) by using a diagnostic algorithm for parameters.
F6: Display or output the results of diagnosis.
STOP: Stop For the constant-current pulse described above, conditions were selected with which the influence of the potential hysteresis phenomenon specific to LIBs and a temperature change caused by an applied pulse are minimized. Resampling from successive measurement data of a transient response curve of a chronopotentiogram response (also called a galvanostatic response) obtained in response to an externally applied constant-current pulse and a noise reduction method were employed, and a data processing method for extracting a true response signal from a signal buried in noise was applied. To reduce noise, data obtained as a result of measurement of the pulse transient response was compressed and smoothed by digital processing. In this compression and smoothing, resampling from the successive measurement data was performed at several tens of points per digit, and simultaneously, the signal was smoothed in a reduction section of the data. These were performed to decrease the noise level of the signal and reduce the data amount. The compressed data was recorded as a csv-format file with header information added thereto.

Next, to allow use of an indicator parameter with which an evaluation can be uniformly made under different measurement conditions, as a method for a degradation evaluation of a battery, an apparent transient resistance function (ATRF(t)) curve calculated from current values and voltage response values before and after application of a constant-current pulse was obtained. This curve was used in calculation of pseudo equivalent circuit parameter values.

Here, to enable uniform evaluation even under different measurement conditions of the temperature (T) at the time of measurement, the magnitude of the pulse (h), and the pulse width ($\tau$), an apparent transient resistance function (ATRF(t) described below) calculated from the current values and the transient response values of the voltage before and after pulse application is used for the transient resistance curve to perform normalization. The validity of this method can be verified in such a manner that, for example, Nyquist plot display (including Bode diagram display) of an impedance response obtained as a result of conversion using the uniformity of normalized curves obtained using the transient resistance change function or parameter values of a circuit for analysis calculated by performing simulation least squares method fitting for the obtained curves is performed, errors caused by the least squares method for curve fitting are evaluated, and the accuracy is used to verify the validity.

Correlation models for (A) raw data (time-series data after down-sampling) of a chronopotentiogram (CP) obtained with a constant-current pulse method, (B) data of various parameter values obtained as a result of an equivalent circuit parameter analysis, and (C) battery state indicating factors (SOH, T, and SOC) are built, and the correlation models are used to estimate, for example, the SOH, T, and SOC. This is implemented by using a computer program in which, for example, a kernel model (a machine learning model using a kernel function) is used as the correlation models. The raw data and the temperature at the time of measurement are assumed as input to the kernel model, for example, the SOH and temperature are assumed as output, and supervised learning is performed. The kernel model is linear relative to a parameter to be obtained, and therefore, the solution is analytically obtained by using the least squares method.

As a result of comparing cases of using the respective correlation models, the accuracy of the results of the machine learning method for diagnosing, for example, the SOH and temperature did not significantly vary.

FIG. 4(*a*), FIG. 4(*b*), FIG. 4(*c*), FIG. 4(*d*), FIG. 4(*e*), FIG. 4(*f*), and FIG. 4(*g*) illustrate the electromotive forces on the charge and discharge paths for cell 1 to cell 7 in Table 3. The electromotive force represented by the vertical axis is a voltage in units of V, and the capacity represented by the horizontal axis is the amount of charge during charge and discharge in units of mAh. It is found that in any of the cells, the path during charge and that during discharge are different and hysteresis characteristics are observed.

Therefore, to realize highly accurate measurement of a transient response (that is, CP) to a direct-current pulse, (A) measurement conditions with which the influences of the potential hysteresis phenomenon and a thermal change are reduced need to be set. Even in measurement under the same temperature condition, the actually measured transient response (that is, CP) differs depending on differences in the magnitude of the applied pulse (h), the pulse width ($\tau$), the direction of the applied pulse, and the form of the applied pulse. Accordingly, for the obtained response, it is determined what measurement conditions allow expression by the same transient resistance function, and a database of the measurement conditions is created. (B) Specifically, in a case of application of a current value that corresponds to a high rate, it was found that as the current value rises, the value of the transient resistance function gradually decreases. It can be understood that this is caused by the influences of the induced potential hysteresis phenomenon and the temperature on the transient resistance function term, and (C) it is desirable to optimize the measurement conditions at the time of application of the constant-current pulse.

<Noise Reduction and Resampling of Measurement Data>

As a constant-current pulse measuring instrument used in the present embodiments, an instrument that allows measurement in a short time and with which noise is reduced to the extent possible was employed. For this instrument, the sampling rate for voltage measurement is set to, for example, 100 kS/sec., and sampling is performed for a very short time (10 μs/sampling). High-speed sampling is thus performed in order to reduce quantized errors on the time axis caused by the sampling. Further, for example, statistical noise is reduced by duplicated measurement, and the S/N ratio is improved by increasing the wave height of the applied constant-current pulse to improve the pulse measurement conditions.

In a case where a single pulse is applied for a period of 10 seconds or more, factors, such as (a) an influence on the differential capacity of the battery (a non-negligible signal change caused by charge or discharge), (b) an influence of a temperature change caused by heat generation and heat dissipation induced by the pulse application, and (c) an increase in processing data due to an excessive increase in the number of pieces of sampling data, are to be additionally considered for a battery diagnosis unlike in a case where the pulse application time is short.

In general, large-amplitude noise superimposed on a transient response waveform formed in response to an applied pulse is observed. Accordingly, noise reduction for extracting a true response signal from measurement data is required. In an example described below, digital noise reduction is performed at the time of data processing. Further, although depending on the measurement range of the pulse transient response, the sampling rate needs to be increased in order to perform an analysis with high accuracy, and measurement data becomes excessively large in this case. Accordingly, in order to perform an analysis of the measurement data with high accuracy in a simplified manner, it is desirable to perform data resampling (compression and smoothing) to reduce the number of pieces of data.

Noise reduction and resampling of measurement data described above can be implemented by, for example, applying data processing for digital noise reduction.

For the data resampling, for example, resampling from transient response measurement data is performed at 20 points/digit, and simultaneously, the signal is smoothed in a section of the data. These are performed to decrease the noise level of the signal and reduce the data amount. The obtained down-sized data is output as a csv-format file with header information added thereto. That is, for example, in a case of measurement data obtained at a sampling rate of 100 kS/s and with a pulse width of 2 s, resampling is performed at regular intervals of 20 points/digit on a logarithmic time axis.

<Normalization of Chronopotentiogram (CP)>

In general, a transient response waveform formed in response to current pulse application differs depending on the battery temperature (T) at the time of measurement, the wave height (h) and wave width (τ) of the applied current pulse, and the number of repetitions. Accordingly, in order to enable uniform evaluation under various measurement conditions, an indicator parameter is used. That is, the transient response waveform is normalized by using the apparent transient resistance function that is calculated from current values and voltage response values measured over a certain period from a time point before pulse application to a time point after application to obtain the indicator parameter. With this method, transient responses obtained under measurement conditions in which the wave height and wave width of the applied current pulse differ can be expressed by specific curves (normalized curves) on the same coordinate axis plane. A database of the curves are created. The data in the database is used as raw data (time-series data after down-sampling) to create a correlation model for the SOH, and the model is used to diagnose a battery, that is, estimate the SOH, T, and SOC.

Further, a pseudo equivalent circuit for simulating a battery reaction is fitted to the normalized curves to obtain various parameters of the pseudo equivalent circuit. This is optimum for analyzing changes in a battery reaction over time, and therefore, a database of the various parameters can be created and used in a diagnosis of, for example, the SOH and SOC of a secondary battery.

Embodiment 1

Figure 13:
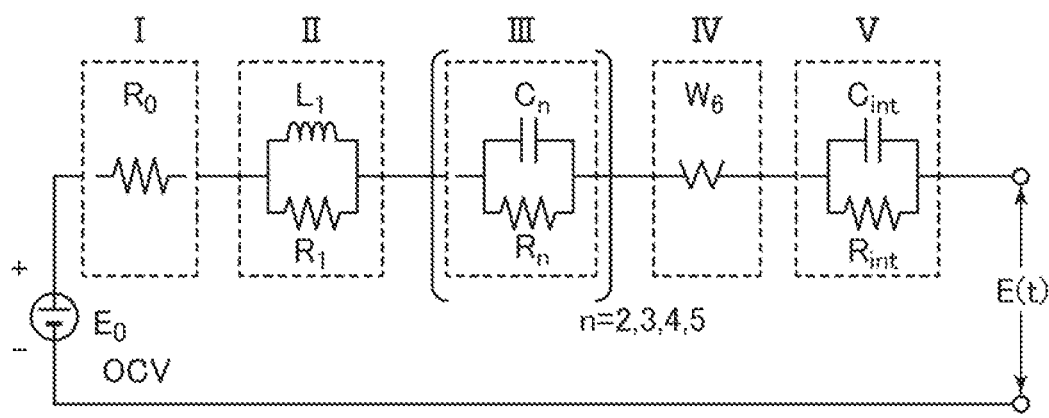
FIG. 13 is a diagram illustrating example equivalent circuit modeling (ECM) of an overall electrode reaction mechanism for a battery used to analyze a chronopotentiogram (CP).

A pseudo equivalent circuit for analysis and a pseudo equivalent circuit in a case of theoretical expression LIBs are illustrated in FIG. 13. The above-described current pulse method is a direct-current method, and therefore, in this pseudo equivalent circuit, all elements of the pseudo equivalent circuit for analysis illustrated in FIG. 13 start operating at the same time when a constant-current pulse is applied, and the sum of the response voltages of the respective elements is regarded as a transient response voltage and output.

Figure 12A:
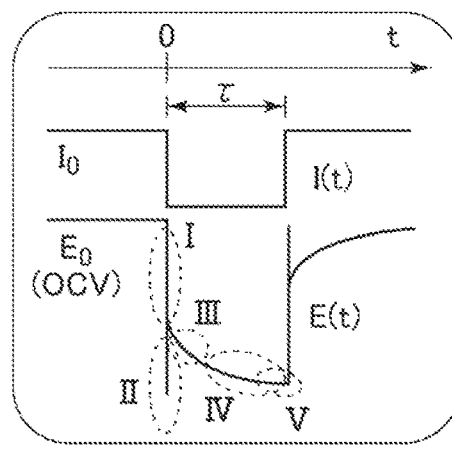
FIG. 12(a) is a diagram illustrating a constant-current pulse that is applied to a battery and a chronopotentiogram (CP) response to the constant-current pulse.
Figure 12B:
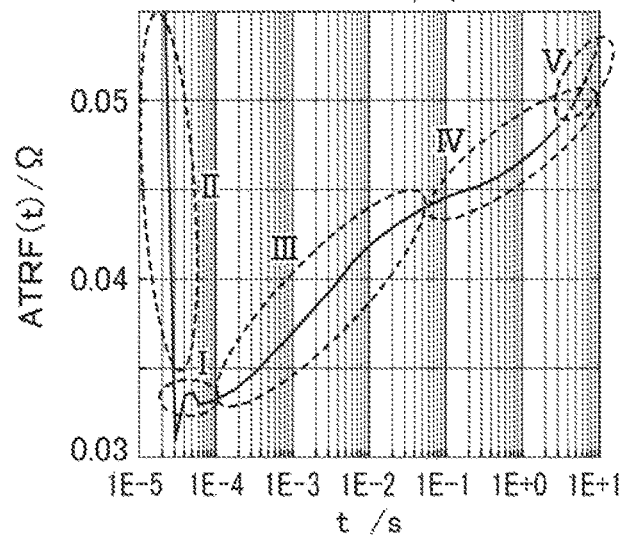
FIG. 12(b) illustrates conversion of the CP response to a normalized curve (ATRF(t))
Figure 12C:
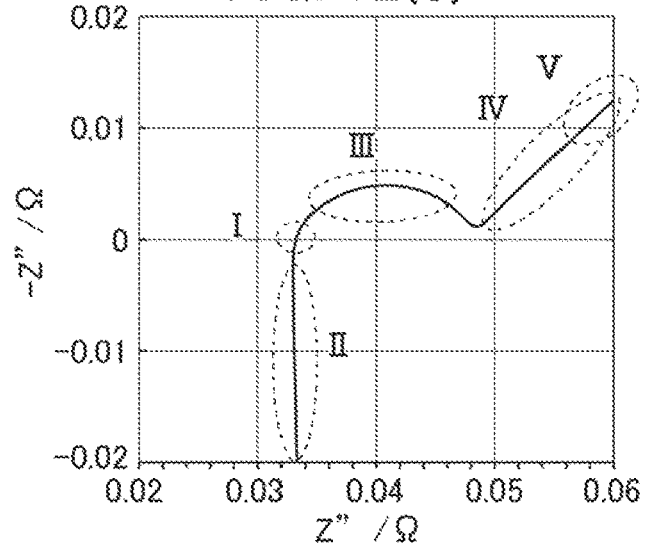
FIG. 12(c) is a diagram illustrating an example Nyquist plot created by using equivalent circuit parameter values obtained as a result of a simulation analysis of ATRF(t).

FIG. 12(a), FIG. 12(b), and FIG. 12(c) are conceptual diagrams illustrating contribution, on the time axis, of element parameters of the pseudo equivalent circuit to the voltage transient response obtained when the constant-current pulse is applied. The elements of the pseudo circuit have specific time constants, and therefore, changes in their contribution can be known on the time axis. From FIG. 12(a), after the L-component response is sufficiently attenuated, responses from the RC circuit group and from the Warburg element are still very small, and therefore, it can be inferred that a time period during which the effects of the responses are negligible exists.

Figure 14:
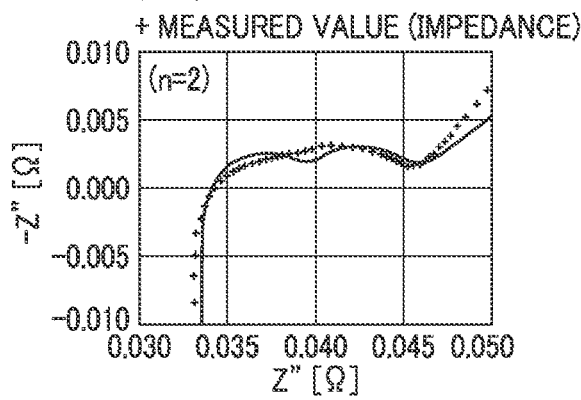
FIG. 14(a1), FIG. 14(a2), FIG. 14(b1), FIG. 14(b2), FIG. 14(c1), FIG. 14(c2), FIG. 14(d1), and FIG. 14(d2) are diagrams illustrating examples of dependence, on the number of RC stages (n=2, 3, 4, or 5), of a Nyquist plot obtained from a parameter evaluation using an equivalent circuit model $<R_0\_RnCn(n=2 \text{ to } 5)\_L_1R_1\_C_{int}R_{int}>$.
Figure 14:
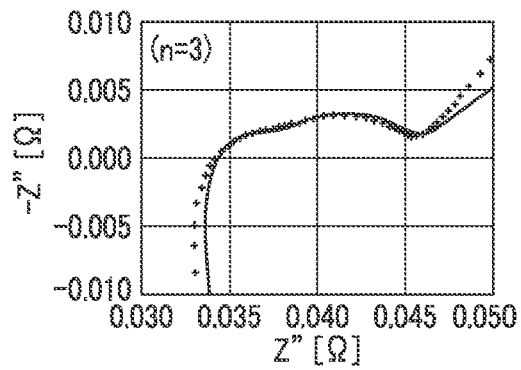
Figure 14:
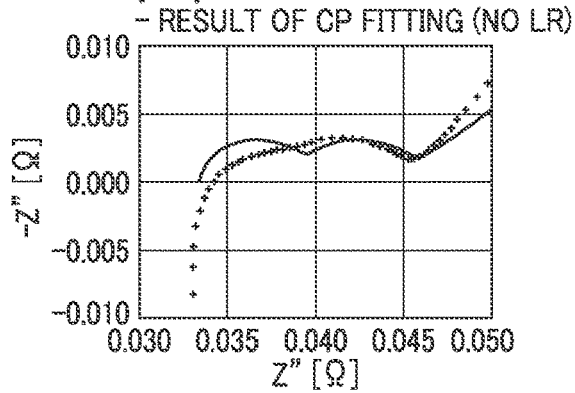
Figure 14:
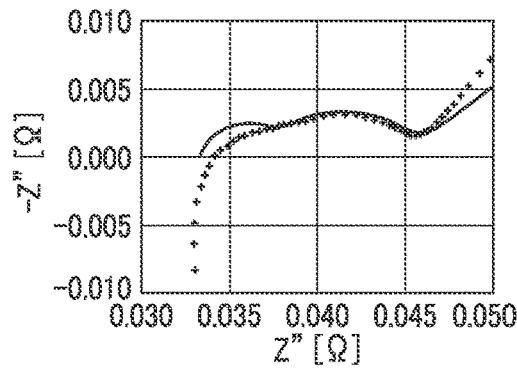
Figure 14:
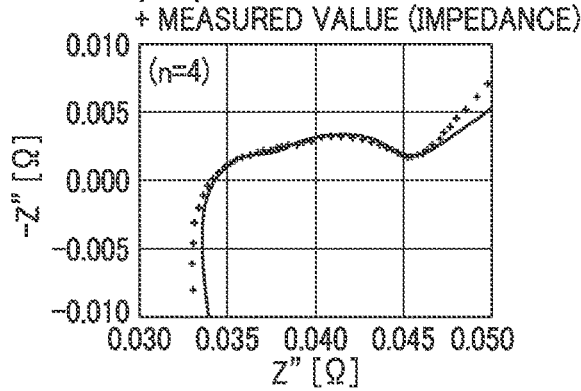
Figure 14:
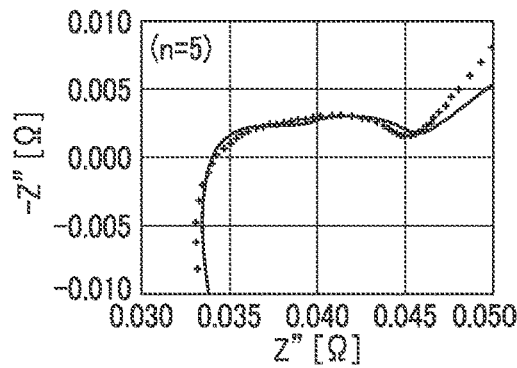
Figure 14:
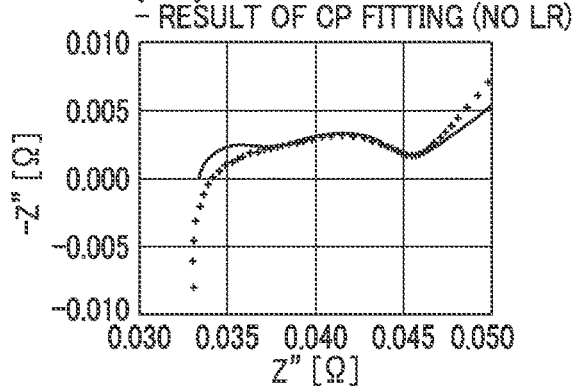
Figure 14:
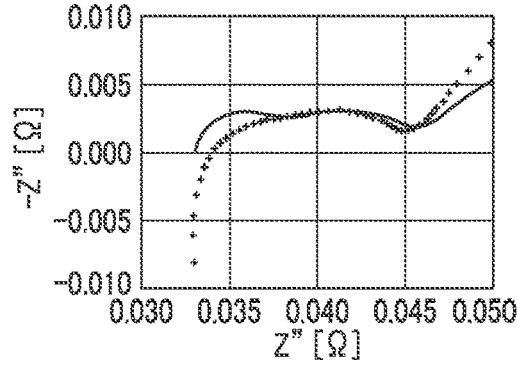
Figure 15A:
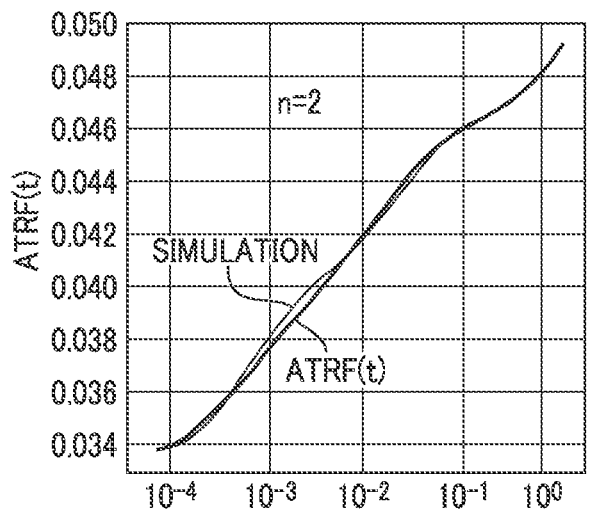
FIG. 15(a), FIG. 15(b), FIG. 15(c), and FIG. 15(d) illustrate examples of the resulting dependence, on n in RnCn in equivalent circuit parameter fitting, of an ATRF(t) plot (FIG. 15(a) n=2, FIG. 15(b) n=3, FIG. 15(c) n=4, FIG. 15(d) n=5).
Figure 15B:
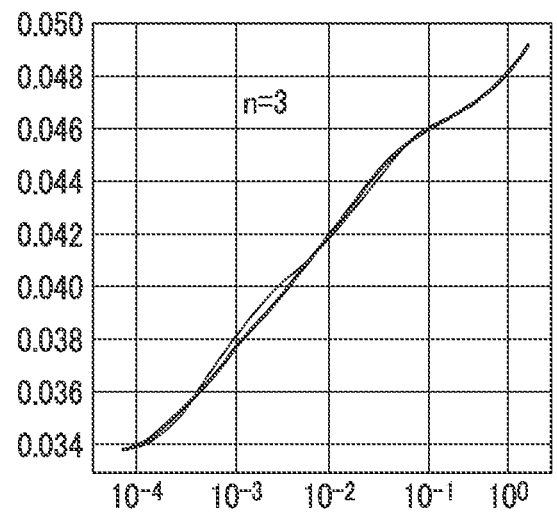
Figure 15C:
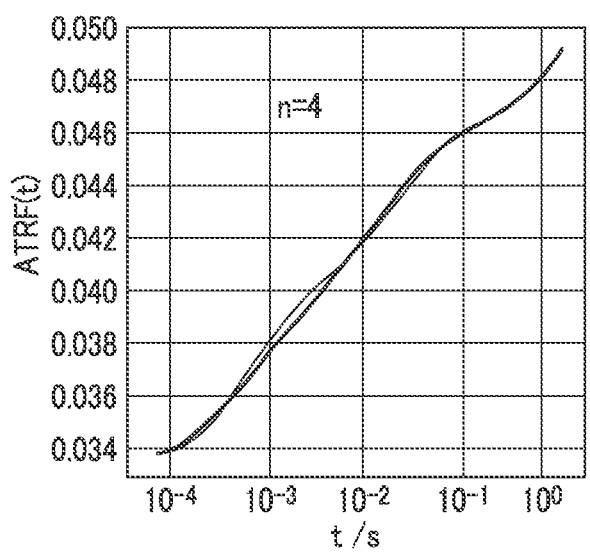
Figure 15D:
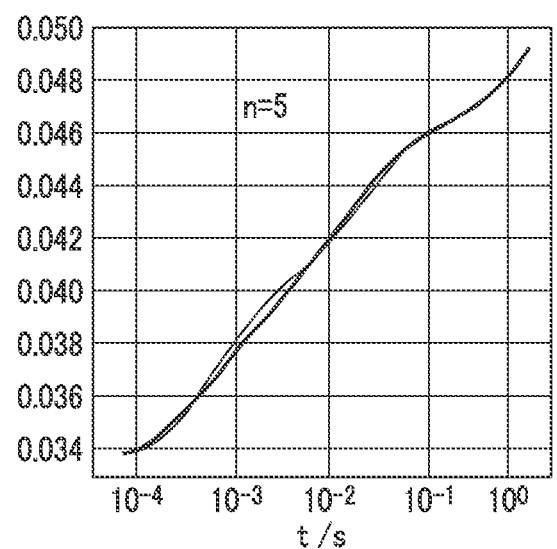

With measurement using an existing pulse method, a Nyquist plot as indicated by a solid line in FIG. 14 is obtained. When this result is compared with an analysis result (indicated by + signs in the figures) using the alternating-current method, the semicircle portions are similar, but the analysis results using the respective methods often do not match.

The cause was discovered by obtaining components of the equivalent circuit for analysis illustrated in FIG. 13 from measurement data obtained by using the pulse method and the alternating-current method. That is, when components R0, L1R1, RnCn (n=2 to 5), W6, and $C_{int}$ were obtained, a difference between the pulse method and the alternating-current method was significant. Accordingly, it was found that, in the data obtained by using the above-described measurement method, involvement of the element parameters on the time axis in FIG. 12(a) had a problem.

Specifically, when compared with the alternating-current method, for a CP response obtained by applying the present invention, an analysis and an evaluation of the components R0, L1R1, W6, and $C_{int}$ are important factors. That is, in measurement of an impedance spectrum using a general alternating-current method, a frequency response analyzer (FRA) is used, and the technique is such that the sinusoidal amplitude of a current or voltage is applied to the measurement system in the charge direction and in the discharge direction alternately and successively, and therefore, the observed impedance output is induced from an electrochemical phenomenon in a steady state.

In general, in a direct-current method, when conditions of a pulse to be applied are selected, the influences of the L component and the potential hysteresis phenomenon can be minimized. Further, in order to verify the uniformity of the CP response to the applied pulse, a curve obtained by normalizing the CP response is created, and parameter values including the components R0, L1R1, W6, and $C_{int}$ are accurately obtained from simulation of the curve.

For this, first, an equivalent circuit model that matches an applied pulse width (time width) considered to be necessary for a pulse transient response analysis and an analysis expression of the equivalent circuit model are calculated. Here, to achieve improvement of the overall good evaluation accuracy, ultimately, a model for the entire frequency range that is measured by using EIS (electrochemical impedance spectroscopy) is to be created. However, the effect of the hysteresis phenomenon needs to be taken into consideration in an analysis of contribution of a voltage loss in a low frequency range, and therefore, the time period corresponding to the low frequency range (≤5 mHz) is excluded in this embodiment, and an experiment and a detailed analysis in the time period are temporarily excluded.

However, in order to select the optimum pseudo equivalent circuit (FIG. 13) that expresses the total cell reaction of an LIB, an evaluation that takes into consideration parameters of (A) the resistance component and the reactance (ωL) component in an ultrahigh-speed range (ten to several hundred μs) considered from the time constants, (B) the Warburg (W) factor of an electrode reaction speed component in a high- and medium-speed range (several milliseconds to several seconds), and (C) the capacitance (Clot) component in a charge-discharge reaction of the battery capacity on the low- and ultralow-speed side is made. Such an evaluation has been scarcely performed to date. The use of the above-described pseudo equivalent circuit that takes into consideration these factors is one of the features of the present invention.

In an analysis of this embodiment, an equivalent circuit for analysis that is less complex than a transmission line model and for which the reliability and quality of fitting can be estimated to be satisfactory is employed. FIG. 13 illustrates one 1 example of this equivalent circuit. However, in fitting in the analysis, the following method is used instead of a technique of a general-purpose CPE (constant phase element).

The CPE technique uses commercially available software and is widely used in the academic field; however, the physicochemical meaning of a scientific phenomenon in which the coefficient is involved is not clear. Therefore, the CPE technique is not employed here, and a technique for improving the fitting accuracy by increasing or decreasing the number of RC (resistance component and capacitance component) factors is used.

In this embodiment, first, in order to enable uniform evaluation under different measurement conditions of the temperature (T) at the time of measurement and the magnitude (h) and pulse width (τ) of a constant-current pulse to be applied, as an indicator parameter for enabling uniform evaluation, a transient resistance calculated from the current values and the transient response values of the voltage before and after pulse application is used. Further, the number of pieces of measurement data is extremely large, and therefore, data resampling is performed.

In this data resampling, measurement data was reduced at substantially regular intervals on the logarithmic time axis such that the features the CP characteristics are not lost. Further, a database (DB) was created by normalizing selected data as CP data.

In general, the current-voltage-time curve of the direct current in the equivalent circuit for analysis illustrated in FIG. 13 can be expressed by Math. 1. The theoretical expression of the impedance of the equivalent circuit for analysis can be expressed by Math. 2. The real part and the imaginary part of Math. 2 are Z' and Z" in Math. 3 respectively, and Math. 4 expresses W6 in Math. 1 and corresponds to the Warburg factor described above.

$$E(t) = \left[ R_0 + R_1 e^{-\frac{R_1 t}{L_1}} + \sum_{n=2}^{5} R_n \left(1 - e^{-\frac{t}{R_n C_n}}\right) + k W_6 t^{\frac{1}{2}} + R_7 \left(1 - e^{-\frac{t}{R_7 C_{int}}}\right) \right] I(t)$$ [Math. 1]

$$Z = R_0 + \frac{j\omega L_1 R_1}{R_1 + j\omega L_1} + \sum_{n=2}^{5} \frac{R_n}{1 + j\omega R_n C_n} + W_6 \omega^{-1/2}(1-j) + \frac{R_7}{1 + j\omega R_7 C_{int}}$$ [Math. 2]

$$Z' = R_0 + \frac{\omega^2 L_1^2 R_1}{R_1^2 + \omega^2 L_1^2} + \sum_{n=2}^{5} \left(\frac{R_n}{1 + \omega^2 R_n^2 C_n^2}\right) + W_6 \omega^{-1/2} + \frac{R_7}{1 + \omega^2 R_7^2 C_{int}^2}$$ [Math. 3]

$$Z'' = \frac{\omega L_1 R_1^2}{R_1^2 + \omega^2 L_1^2} - \sum_{n=2}^{5} \left(\frac{\omega R_n^2 C_n}{1 + \omega^2 R_n^2 C_n^2}\right) - W_6 \omega^{-1/2} - \frac{\omega R_7^2 C_{int}}{1 + \omega^2 R_7^2 C_{int}^2}$$

$$W_6 = \frac{RT}{\sqrt{2}\, n^2 F^2} \left(\frac{1}{C_O^0 \sqrt{D_O}} + \frac{1}{C_R^0 \sqrt{D_R}}\right)$$ [Math. 4]

In a state diagnosis of a battery using these expressions, first, the battery characteristics are analyzed and evaluated in detail in accordance with the above-described method to select and clarify a degradation factor associated with the use history of the secondary battery, the temperature at the time of measurement, and a state diagnosis factor. Accordingly, correlations between the degradation, temperature, or state diagnosis factor and various parameter values can be grasped.

Next, the dependence of pieces of data of the various parameters on the SOH, T, and SOC is checked, and an appropriate correlation expression is derived. For this, for example, a diagnosis accuracy within 5% is attained on the basis of a machine learning method. That is, a technique for evaluating the SOH, T, SOC, and SOL of a battery with high accuracy can be provided.

Next, an analysis method for a transient response to a constant-current pulse is described. As illustrated in FIG. 12, when the voltage and the current immediately before pulse application are respectively denoted by E0 and I0, the amounts of change in the voltage value and in the current value at elapsed time t after the application of the constant-current pulse are expressed by v(t) and u(t) respectively as in Math. 5.

$$v(t) \equiv E(t) - E_0$$

$$u(t) \equiv I(t) - I_0 \qquad \text{[Math. 5]}$$

The apparent resistance value at time t is ATRF(t) described above, which can be calculated as ATRF(t)=v(t)/u(t) in accordance with the Ohm's law.

The value of ATRF(t) can be expressed by Math. 6 by using the above Math. 1, which is a theoretical analysis expression.

$$ATRF(t) = \frac{v(t)}{u(t)} = R_0 + R_1 e^{-\frac{R_1 t}{L_1}} + \sum_{n=2}^{5} R_n \left(1 - e^{-\frac{t}{R_n C_n}}\right) + \frac{2\sqrt{2}}{\sqrt{\pi}} W_6 t^{\frac{1}{2}} + R_7 \left(1 - e^{-\frac{t}{R_7 C_{int}}}\right) \qquad \text{[Math. 6]}$$

The value of ATRF(t) has an advantage that the value is observed as one analysis curve for the same measurement target battery regardless of the experimental conditions of constant-current pulse application, by normalization described below.

In a case where a single constant-current pulse is applied for a time length of τ, and thereafter, interrupted, Math. 6 can be extended to an area after the interruption. That is, Math. 7 (which is called "extended ATRF" in a case where Math. 7 needs to be distinguished from Math. 6) is applicable. The CP analysis method using Math. 7 also enables data normalization.

$$ATRF(t) \equiv \frac{E(t) - E(0)}{I(t) - I(0)}, \quad (0 < t < \tau) \qquad \text{[Math. 7]}$$

$$ATRF(t - \tau) \equiv \frac{E(t) - E(\tau)}{I(t) - I(\tau)}, \quad (t > \tau)$$

Further, a series of constant-current pulses formed of a plurality of pulses can also be handled by extending Math. 6 to an area after interruption of the pulses.

Accumulation of time-series data of batteries having different degradation pattern histories In order to enable uniform evaluation even under different measurement conditions of, for example, the temperature (T) at the time of measurement, the pulse magnitude (h), and the pulse width (τ), (A) the value of ATRF(t) calculated from the current values of a constant-current pulse before and after application of the constant-current pulse and the transient response value of the voltage for the constant-current pulse is recorded to a DB. Further, (B) with sampling at an order of μs, the number of pieces of measurement data becomes excessively large, and therefore, the number of pieces of measurement data is reduced at substantially regular intervals on the logarithmic time axis such that the CP characteristics are not lost to thereby reduce the measurement data. Further, (C) selected data selected from the measurement data is normalized to create a DB of the normalized data. Further, (D) the selected data is converted to parameters of component factors of the equivalent circuit for analysis to create a DB. At this time, (E) when the DB of the equivalent circuit parameters is created, the least squares method is applied to fitting of the normalized curve to determine optimum values. (F) The created DBs are used to derive a correlation expression for the time, temperature, degree of charge, and degree of degradation, (G) machine learning is performed based on the correlation expression, and (H) a least squares method error evaluation, which is an evaluation method for the degree of degradation, temperature, and degree of charge, can be made to demonstrate the effectiveness of this technique.

To accumulate the time-series measurement data, it is desirable to expose measurement target batteries to various environments (the batteries are used at a high temperature and a low temperature, the batteries are left, and the batteries are used continuously, and the batteries are used at a high rate), induce degradation of the charge-discharge characteristics, and measure the ATRF(t) characteristics of the respective batteries under these environments. Accordingly, the use condition range of a secondary battery to which the diagnosis method of the present invention is applicable can be extended.

Creation of Database of ATRF(t) Parameter of Battery Having Use History

FIG. 2 is an example flowchart illustrating creation of a database of the ATRF(t) parameter that is assumed in the following description. FIG. 2 is a flowchart of creation of a database of the normalization function (ATRF), creation of the diagnostic algorithm formula (single factor or a plurality of factors among the SOH, temperature, SOC, SOP, and SOL) based on machine learning, and installation of the database and the diagnostic algorithm formula in a diagnostic instrument. In the steps in this flowchart, the following procedures are performed.

Creation of database of ATRF(t) parameter of battery having use history

FIG. 2 is an example flowchart illustrating creation of a database of the ATRF(t) parameter that is assumed in the following description. FIG. 2 is a flowchart of creation of a database of the normalization function (ATRF), creation of the diagnostic algorithm formula (single factor or a plurality of factors among the SOH, temperature, SOC, SOP, and SOL) based on machine learning, and installation of the database and the diagnostic algorithm formula in a diagnostic instrument. In the steps in this flowchart, the following procedures are performed.

START: Start
G0: Set a test target battery.
G1: Set the temperature.
G2: Perform a charge-discharge characteristics test.
G3: Calculate the SOH value.
G4: Set the SOC value.
G5: Measure responses (current, voltage, temperature, and time) to pulse application.
G6: Calculate the normalization function (ATRF(t)).
G7: Accumulate and select pieces of data, return to G1, and repeat the procedures. When a predetermined number of pieces of data are accumulated, the flow proceeds to the next step.

G8: Database (factors (SOH, temperature, SOC, SOP, and English

G9: Perform machine learning (create an algorithm function).

G10: Install the algorithm function in a diagnostic instrument.

STOP: Stop

In the battery diagnosis method of the present invention, (A) for an excessive large amount of data obtained by constant-current pulse application (measurement is performed under a condition in which the temperature and SOC are changed even for one battery, for example, 19×21=399 or more, see FIG. 11), (B) a database (DB) of the ATRF(t) parameter from a normalized CP response is created, and the values of various parameters of the equivalent circuit for analysis are obtained by curve fitting using this DB. (C) The physicochemical meanings of the parameters are considered. Further, (D) the battery characteristics are analyzed and evaluated in detail and a marker factor of capacity degradation that depends on the history is selected and clarified to thereby (E) grasp correlations between degradation, and normalized measurement data and the various parameter values.

Note that the above-described measurement is performed for a plurality of batteries under the same conditions to verify the reproducibility. Further, measurement target batteries are exposed to various environments (the batteries are used at a high temperature and a low temperature, the batteries are left, and the batteries are used continuously, and the batteries are used at a high rate) to induce degradation of the charge-discharge characteristics, measure the ATRF(t) data and the impedance characteristics of the respective batteries under the conditions, and perform an analysis similar to that described above. Accordingly, the temperature dependence and the degradation pattern dependence (high-temperature history, low-temperature history, and high-rate charge-discharge history) of various parameter values are grasped, and the diagnosis accuracy is increased. Further, a plurality of general-purpose batteries for which a database is created is selected such that the batteries are made of various battery materials, are from various manufacturers, and have various sizes to thereby increase the versatility of the diagnosis method of the present invention.

Further, a database of the corresponding characteristics of the degradation histories of the secondary batteries under various use environments is created and used to thereby facilitate verification and improvement of the accuracy of the diagnostic algorithm.

Diagnosis by Machine Learning

A machine-learning-based diagnosis of the SOH, temperature (T), and SOC using the DB of measurement data can be made by, for example, applying a diagnosis technique using an alternating-current impedance method described in PTL 1 to the present invention.

Therefore, a pseudo equivalent circuit for analysis common to both measurement methods, namely, a constant-current pulse method and an alternating-current impedance method, is used, and the measurement methods are compared with each other by using a diagnostic algorithm in which equivalent circuit parameters obtained in the measurement methods are used in a degradation diagnosis and by using a diagnostic algorithm obtained by performing machine learning of correlations between a raw database and battery degradation without conversion to pseudo equivalent circuit parameters. Accordingly, it is possible to demonstrate that the degree of degradation can be numerically evaluated quickly with high accuracy.

Machine Learning for Estimation of SOH, T, and SOC Values (1) Learning of Correlation Model Using Equivalent Circuit Parameters In a case where an SOH evaluation using equivalent circuit parameters from impedance characteristics is made, it is effective to create a database of the impedance values and use the database in a degradation diagnosis algorithm. The effectiveness is indicated in, for example, PTL 1. In PTL 1, an algorithm for a degradation diagnosis based on a machine learning method into which development of the latest information engineering is introduced is used on the basis of information in the database of the impedance values.

In estimation of the SOH, T, and SOC values, three cases were studied for an input vector of a kernel model of the machine learning method. Specifically, for (A) a case where the database (DB) of the impedance characteristics is used, (B) a case where a DB of equivalent circuit parameters calculated from the impedance characteristics is used, and (C) a case where a DB of normalized data calculated from CP obtained by a constant-current pulse method and the parameters of the equivalent circuit for analysis for the normalized data is used, the results from the respective cases were studied, and an evaluation method for the degree of degradation, the temperature at the time of measurement, and the state of charge that is optimum and practical for a constant-current pulse method was selected.

(2) Learning of Correlation Model Using Measurement Raw Data

An object of this function is to (A) build a correlation model for CP raw data of a response to a constant-current pulse (time-series data after noise processing and down-sampling and impedance data) and for the SOH, T, and SOC and to (B) estimate the SOH, T, and SOC from the model. In a program for a machine learning method created here, a kernel model is used as the correlation model. The raw data and the temperature at the time of measurement are assumed as input to the kernel model, the SOH, T, and SOC are assumed as output, and supervised learning is performed.

The kernel model is linear relative to a parameter to be obtained, and therefore, the solution is analytically obtained by using the least squares method. The mathematical expression of the kernel model and the computational expression of learning are omitted here.

In a case where time-series data after down-sampling is used as the raw data, the sampling times of respective pieces of data need to be synchronized. For this, in the created program, the sampling times of the pieces of data are synchronized by smoothing spline interpolation.

Embodiment 2

Selection of optimization conditions for pulse measurement

Figure 5:
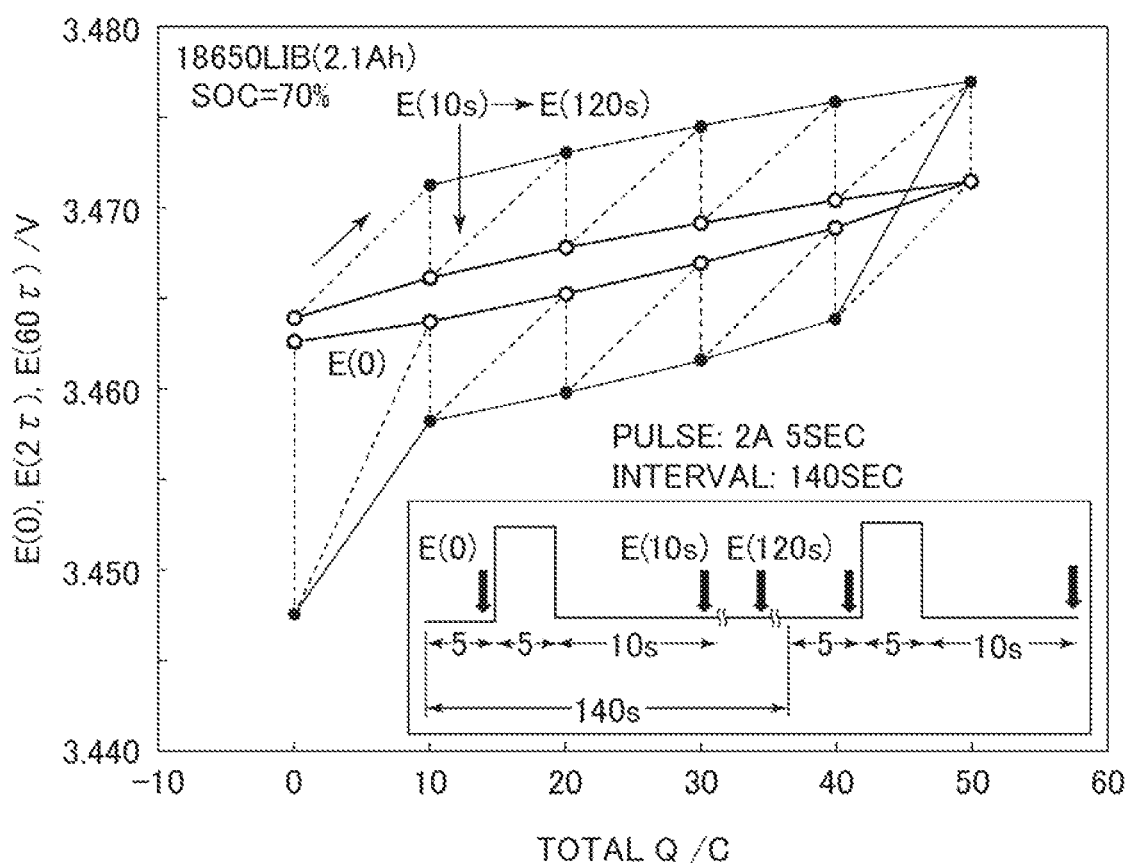
FIG. 5 illustrates an actual example of a potential hysteresis phenomenon and indicates changes in the OCV value after repeated application of a current pulse in one direction.

To realize highly accurate measurement of a transient response (CP) to a direct-current pulse, measurement conditions for reducing or avoiding the influences of the potential hysteresis phenomenon and a thermal change need to be set. For this, an experimental study was made. Here, the results of a study of the 18650 cylindrical-type LIB cell having a positive electrode made of a ternary metal oxide and a negative electrode made of graphite (from company A, capacity; 2200 mAh), the 26650 cylindrical-type LIB cell having a positive electrode made of olivine iron and a negative electrode made of graphite (from company B, capacity; 3000 mAh), and the laminated rectangular-type LIB cell having a positive electrode made of a ternary metal oxide and a negative electrode made of graphite (from company C, capacity; 240 mAh) are described. FIG. 5 illustrates the results from pulse setting conditions in which the pulse width is set to 5 seconds and 10 seconds and the applied current value is 2.00 A (corresponding to 0.67 C rate). Under these conditions, in a case where a pulse is applied in the same direction in a charge or discharge mode, a difference of 1 to 2 mV was observed as a change from the E(0) value after an elapse of 2 minutes since the end of application. The behavior of the E(0) value in a case where a pulse is applied in the same direction was similar to a behavior in an experimental result measured in a different battery system.

More specifically, FIG. 5 illustrates an actual example of a potential hysteresis phenomenon that represents changes in the OCV value after repeated application of a current pulse in one direction. The pulse width is (5.0 s), the wave height (2.0 A) has an effect, the number of repetitions is five, (the electricity amount: ±0.95 C), the wait time is (120 s), and the measurement temperature is 25° C. (18650-type LIB (2200 mAh)).

Figure 6:
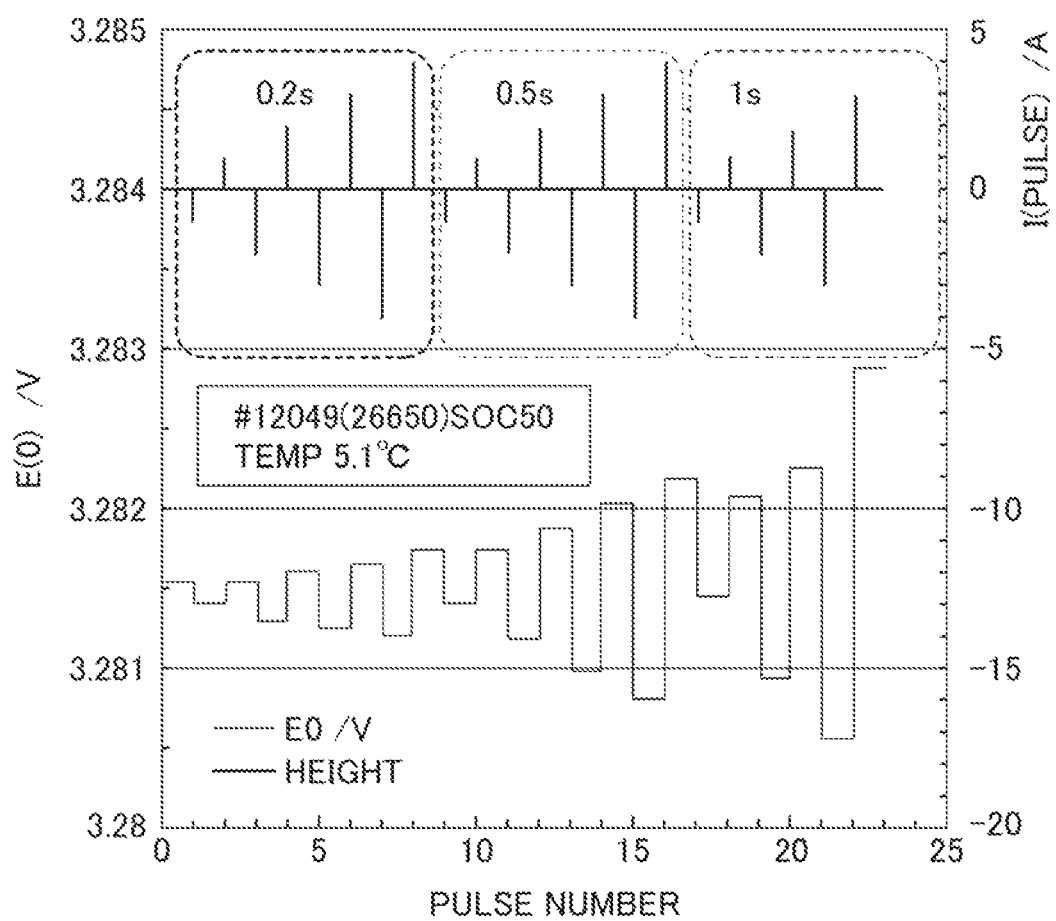
FIG. 6 illustrates an actual example of a potential hysteresis phenomenon and indicates changes in the OCV value after repeated application of a current pulse (a response made in a case where a current pulse is repeated in the charge and discharge directions and when the application time and the applied current value are changed).

Next, in a case where a pulse is applied in the opposite direction in which the charge or discharge mode is reversed, a difference of 10 mV or more was observed as a change from the E(0) value after an elapse of one minute since the end of application. FIG. 6 illustrates changes in the OCV value (E(0)) 60 seconds after the end of pulse application in a case where application is performed while reversing of the current pulse direction is repeated. From this experiment, it was found that the voltage fluctuates up and down depending on the pulse direction, and the magnitude of the voltage depends on the pulse height and width.

More specifically, FIG. 6 illustrates an actual example of a potential hysteresis phenomenon that represents changes in the OCV value after repeated application of a current pulse (responses in a case where a current pulse is repeated in the charge and discharge directions and when the application time and the applied current value are changed). Here the following conditions are used: the pulse widths is set to (0.2, 0.5, and 1 s), the wave height (1, 2, 3, or 4 A) that is, (the electricity amount is ±0.2 to ±3.0 C), the wait time (60 s), the measurement temperature 5.1° C., the SOC 50%, and the SOH 0.95 (26650-type LIB (3000 mAh)).

Figure 7:
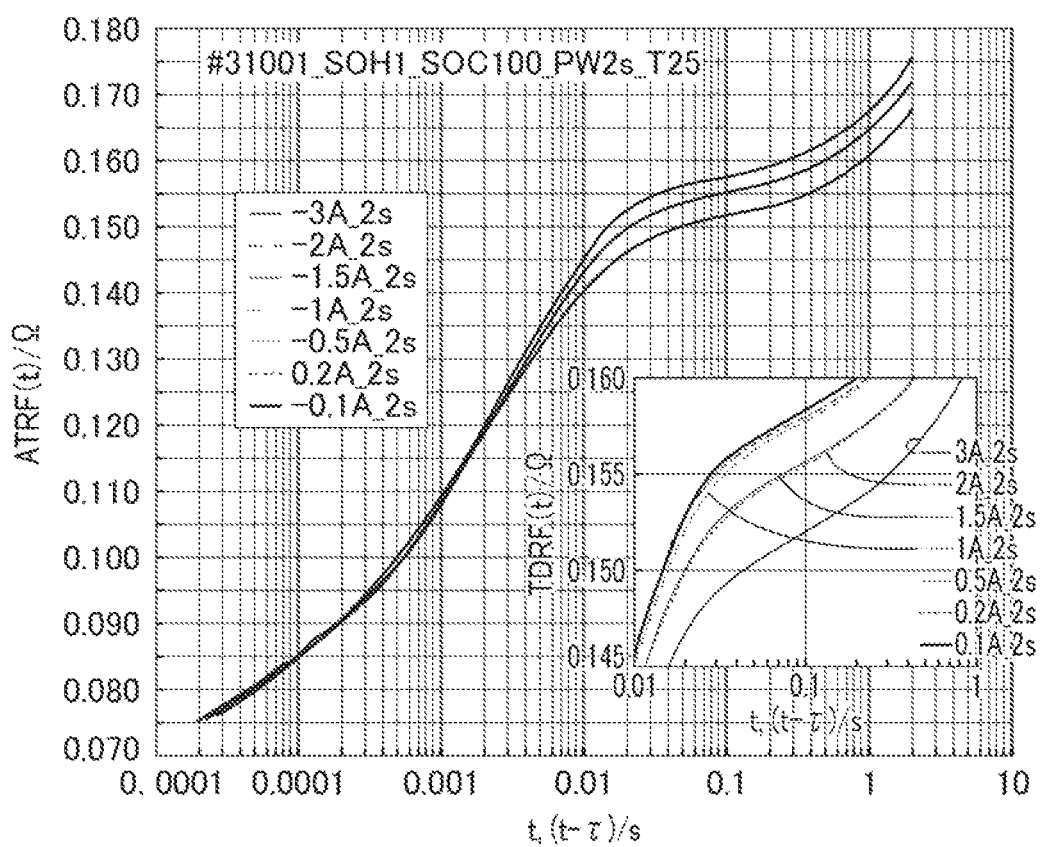
FIG. 7 illustrates changes in curves obtained by making an experimental study in which a negative current pulse from a 0.37 C rate to a 11.1 C rate is applied and converting CP responses obtained with the respective applied current values to an ATRF(t) term.

From this figure, a fluctuation of about 1.0 mV caused by application of a pulse for one second with the current value of the pulse height of 2 C was observed. Accordingly, the influences of the potential hysteresis and a temperature change on the height of the applied pulse, that is, the magnitude of the current value, were studied. Here, the study was made for a case where a pulse is applied with a pulse width of two seconds and where the magnitude of the applied current value is 0.37 to 11.1 C rate. Curves obtained by converting CP responses obtained with the respective applied current values to pieces of normalized data (ATRF(t) term) are illustrated in FIG. 7. When the applied current is 3.7 C rate value or below, the ATRF(t) curves satisfactorily overlap.

It was found that at a high rate, the value of ATRF(t) gradually decreases as the rate rises. It can be understood that this is caused by the influences of the induced potential hysteresis phenomenon and the temperature on the ATRF(t) term. When the rate was increased from 5.5 to 11.1 C, the temperature changed such that the temperature rose from 2.0 to 7.0° C. after applying for two seconds. Here, the decrease rate of the ATRF(t) value at a 5.5 C rate was about 5%, and therefore, it was determined that a current of 5 C rate or less is to be selected as the applied current value.

FIG. 7 illustrates changes in curves obtained by making an experimental study in which a negative current pulse from a 0.37 C rate to a 11.1 C rate is applied and converting CP responses obtained with the respective applied current values to the ATRF(t) term. Here, the applied pulse width is 2 s, the measurement temperature is 25° C., the tested cell; SOH 1.00, SOC 100% (rectangular-type 5552524 LIB (270 mAh)).

Embodiment 3

As the diagnostic algorithm of the machine learning method described above, an algorithm according to the description of PTL 1 can be applied as described below. That is, the battery diagnosis apparatus according to the present invention can directly calculate and estimate the degree-of-degradation value by a degree-of-degradation value calculation unit based on the least squares method, which is used as a technique for machine learning.

Note that machine learning in the present invention conforms to the method described in PTL 1. As the variable in PTL 1, instead of measurement impedance data or data of pseudo equivalent circuit parameter values obtained as a result of analysis of the impedance, time-series normalized data (ATRF(t)) obtained by normalizing, down-sampling, and smoothing an applied pulse transient response or data of pseudo equivalent circuit parameter values obtained as a result of analysis of the transient response is used as the variable.

Next, the battery diagnosis method of the present invention is described. In this method, for example, the degree-of-degradation value calculation unit learns a linear coefficient of the degree-of-degradation value by using the least squares method and directly calculates and estimates the degree-of-degradation value.

Figure 3:
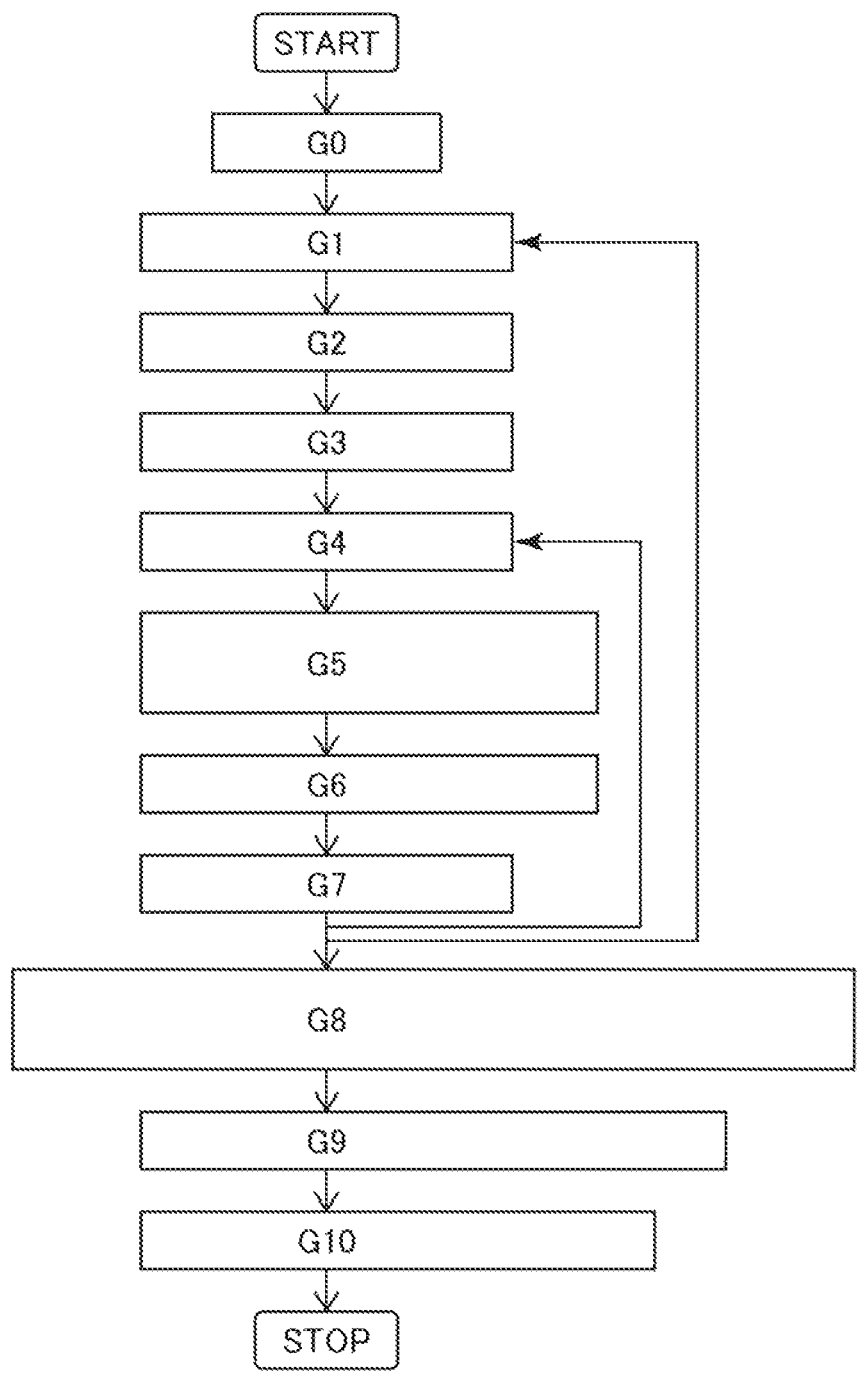
FIG. 3 is a flowchart illustrating creation of a database of a normalization function (ATRF), creation of a diagnostic algorithm function (a single factor or a plurality of factors among the SOH, temperature, SOC, SOP, and SOL) by machine learning, and installation of the database and the diagnostic algorithm function in a diagnostic instrument.
Figure 4A:
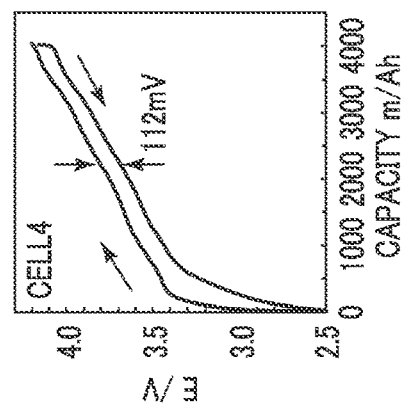
FIG. 4(a), FIG. 4(b), FIG. 4(c), FIG. 4(d), FIG. 4(e), FIG. 4(f), and FIG. 4(g) illustrate examples of a hysteresis phenomenon observed in LIBs and illustrate the charge-discharge characteristics of the various general-purpose LIBs illustrated in Table 1 at a low rate (a constant current at a 0.1 C rate (CC mode) and a CV mode) and at a measurement environment temperature of 25.0° C.
Figure 4B:
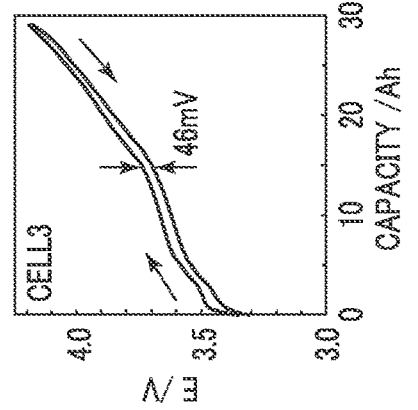
Figure 4C:
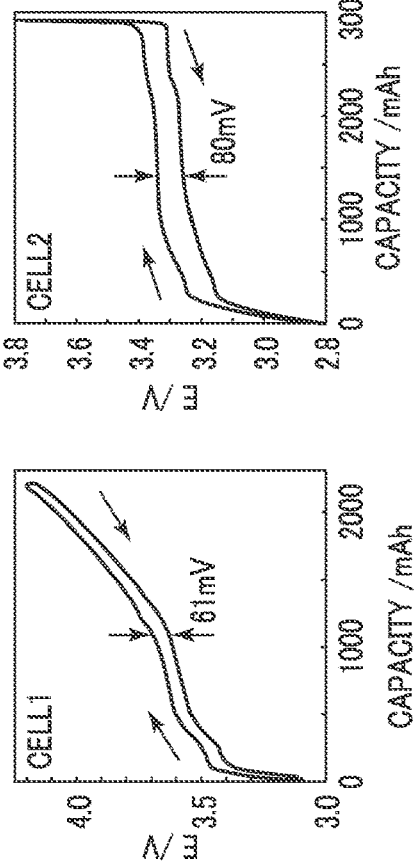
Figure 4D:
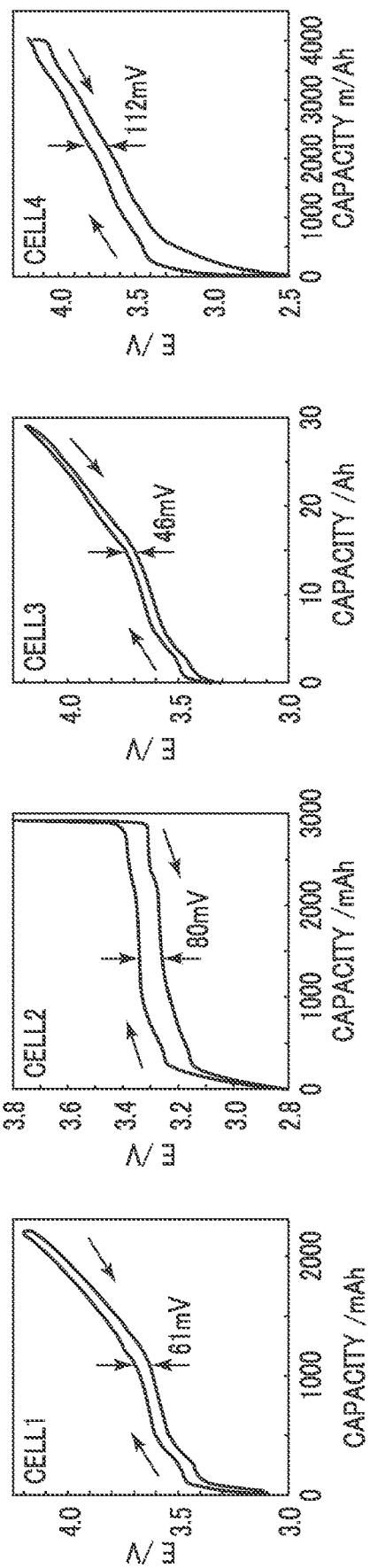
Figure 4E:
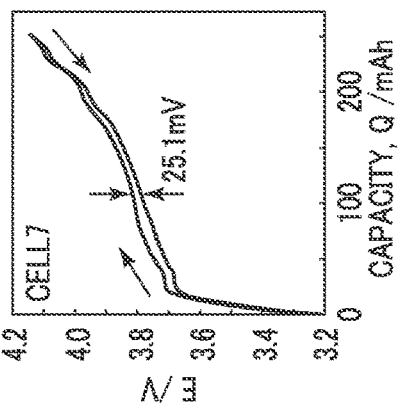
Figure 4F:
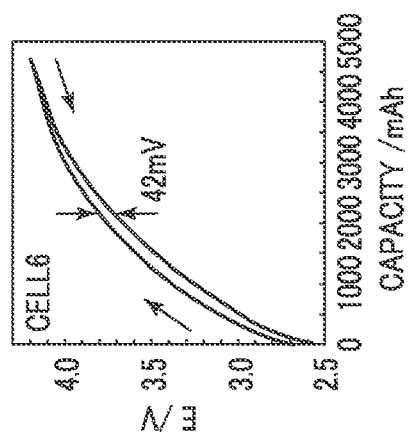
Figure 4G:
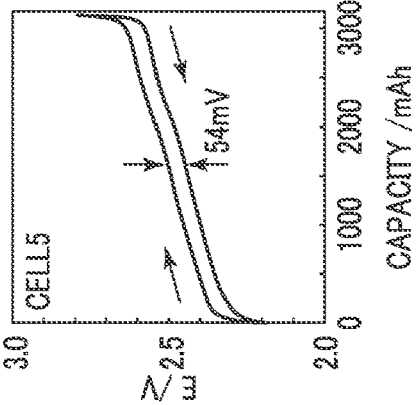

For this, first, for a test target battery for which the SOH value (degree-of-degradation value) is known and for which ATRF(t) has been measured in accordance with the flowchart illustrated in FIG. 3 or parameters of the equivalent circuit for analysis are known, an estimated value α of a kernel coefficient corresponding to the SOH value is calculated and learned. Next, an SOH estimation algorithm in which this estimated value α is implemented is built. This algorithm is used to calculate, for a test target battery for which the SOH value is unknown, the SOH value corresponding to the measured ATRF(t) or to the parameters of the equivalent circuit for analysis. With this method, degradation of the battery can be determined directly from the measured ATRF(t) or from the parameters of the equivalent circuit for analysis.

As a more general method, a method for determining a degree-of-degradation value y from measured ATRF(t) or a parameter x of the equivalent circuit for analysis using a kernel model is specifically described.

y can be approximated by a linear combination of the following one-dimensional kernel function $K(x, x_i)$ (Math. 8 and Math. 9). The coefficient α can be determined from input-output data x, y by learning using the least squares method.

$$y = \sum_{i=1}^{n} \alpha_i K(x, x_i) \quad \text{[Math. 8]}$$

$$K(x, x_i) = \exp\left(-\frac{1}{2}(x - x_i)^T \sum\nolimits^{-1} (x - x_i)\right) \quad \text{[Math. 9]}$$

(Here, $\Sigma^{-1}$ is the inverse matrix of a covariance matrix.)

When this is expressed by a vector, the expression is as follows.

$$\Phi(x_k) = [K(x_k, x_1) \ldots K(x_k, x_n)] \quad \text{[Math. 10]}$$

$$\alpha = \begin{bmatrix} \alpha_1 \\ \vdots \\ \alpha_n \end{bmatrix} \quad \text{[Math. 11]}$$

$$\hat{y}_k = \sum_{i=1}^{n} \alpha_i K(x_k, x_i) = \Phi(x_k)\hat{\alpha} \quad \text{[Math. 12]}$$

From Math. 13 to Math. 15, the estimated value α of the coefficient is learned so as to minimize the square error.

$$\Phi^T = \begin{pmatrix} K(x_1, x_1) & \cdots & K(x_1, x_n) \\ \vdots & \ddots & \vdots \\ K(x_n, x_1) & \cdots & K(x_n, x_n) \end{pmatrix} \quad \text{[Math. 13]}$$

$$Y = \begin{bmatrix} y_1 \\ \vdots \\ y_n \end{bmatrix} \quad \text{[Math. 14]}$$

$$\hat{\alpha} = (\Phi^T \Phi + \lambda I)^{-1} \Phi^T Y \quad \text{[Math. 15]}$$

(Here, λ is a regularization parameter.)

The learned estimated value α of the coefficient can be used to estimate the estimated values $y_k$ (for example, SOH, T, and SOC) from Math. 12.

The method has been described above in which a linear coefficient of the degree-of-degradation value is learned by using the least squares method and the degree-of-degradation value is directly calculated and estimated; however, a least squares stochastic classifier including a pattern classification algorithm based on the least squares method, which is used as a technique for machine learning, can also be used in a diagnosis.

The least squares stochastic classifier for this first calculates and learns an estimated value $\alpha^{(y)}$ of a Gaussian kernel coefficient for some classification categories from ATRF(t) or from parameters of the equivalent circuit for which the degree-of-degradation value is known for analysis by using a learning algorithm in the processes from G1 to G6 illustrated in FIG. 3. Next, in the processes from G8 to G10 illustrated in FIG. 3, a classification algorithm in which the estimated value $\alpha^{(y)}$ of the Gaussian kernel coefficient thus obtained is implemented is built. This algorithm can be used to calculate the posteriori probability p(y|x) that the measured impedance of a battery for which the degree-of-degradation value is unknown belongs to each classification category and to estimate the classification category y. With this method, ATRF(t) obtained from the measured CP response in F5 in FIG. 2 or the parameters of the equivalent circuit for analysis can be used to determine degradation of the battery.

Embodiment 4

Process for Smoothing and Compressing Pulse Measurement Data

Pulse measurement conditions in an super high-speed range under which resistance values ($R_0$ and $R_1$) with which the effect of the inductance (L) component is minimized can be calculated were studied. Software for extracting a true response signal by removing noise superimposed on a measured pulse transient response was selected and improved, and a data processing method using the software was established. Although depending on the measurement time period of a pulse, the capacity of measurement data becomes excessively large depending on the sampling rate, and therefore, a data resampling method for performing an analysis with high accuracy in a simplified manner was studied. First, a change point detection function and a smoothing function for reducing superimposed noise in a pulse transient response waveform were developed, and a data processing method for extracting a true response signal was established. In the smoothing, a spline curve based on a spline method was created to perform data processing. At the same time, a program for compressing and smoothing measurement data for which the capacity is excessively large was created. Resampling from transient response measurement data was performed at 20 to 100 points/digit, and simultaneously, the signal was smoothed in a section of the data. These were performed to decrease the noise level of the signal and reduce the data amount. The obtained down-sized data is output as a csv-format file with header information added thereto. In a case of measurement data at a sampling rate of 100 kS/s, resampling was performed at 20 to 90 points/digit at regular intervals on the logarithmic time axis, and the signal was smoothed in a reduction section of the data to study the degree of noise reduction. The functions of the devised prototype measurement processing software were experimentally verified using the LIBs illustrated in Table 3 above. An example of the result is illustrated in FIG. 8.

From the result, it was verified that noise could be reduced by smoothing. Further, with the data processing, data handling performed thereafter could be implemented in several seconds. Examples of the resulting numbers of pieces of data obtained by down-sampling are illustrated in Table 2.

TABLE 4

Changes in the number of pieces of data obtained by down-sampling
(1: Moving average in a window width, 2: Regular intervals for each digit)

|  | Transient response 1 | Transient response 2 | Total |
|---|---|---|---|
| Original data | 100001 | 168152 | 268153 |
| Down-sampling 1 | 372 | 440 | 812 |
| Down-sampling 2 | 97 | 48 | 145 |

FIG. 8 is a diagram illustrating example resampling of measurement data, and resampling is performed in this example such that the intervals are equal to each other for the logarithm of the time axis. Here, the processing method of the change point detection function and the smoothing function is applied to pulse transient response (CP) measurement data to reduce superimposed noise, down-sampling processing is performed, and data points at which a true response signal is extracted are illustrated (measurement temperature 25° C., pulse width 2 s, wave height −2 A, SOH=0.982, and SOC=50% (18650 LIB (2200 mAh)).

Embodiment 5

Calculation of Normalized Curve from CP Transient Response

Figure 9:
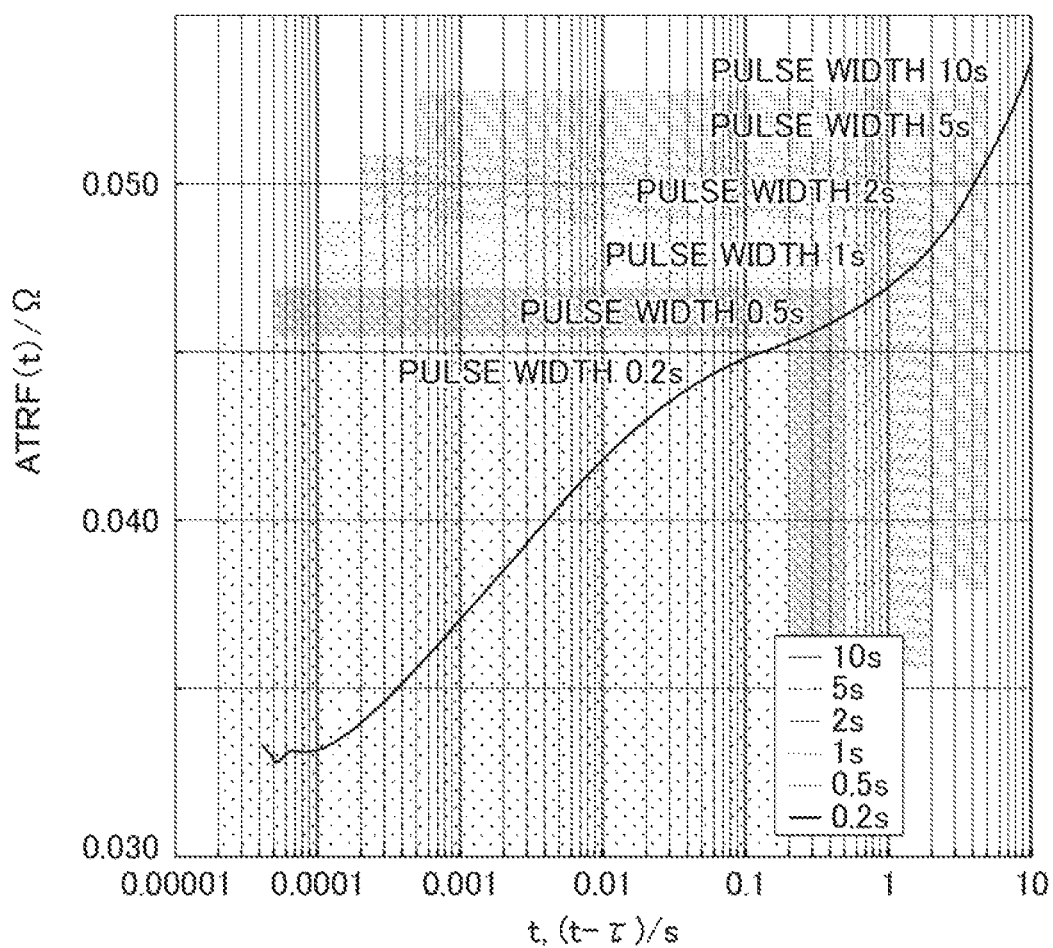
FIG. 9 is a diagram illustrating an example plot of ATRF(t) relative to log(t) obtained when measurement is performed at a constant wave height (−2.00 A) while the pulse width of the applied current is changed.
Figure 10A:
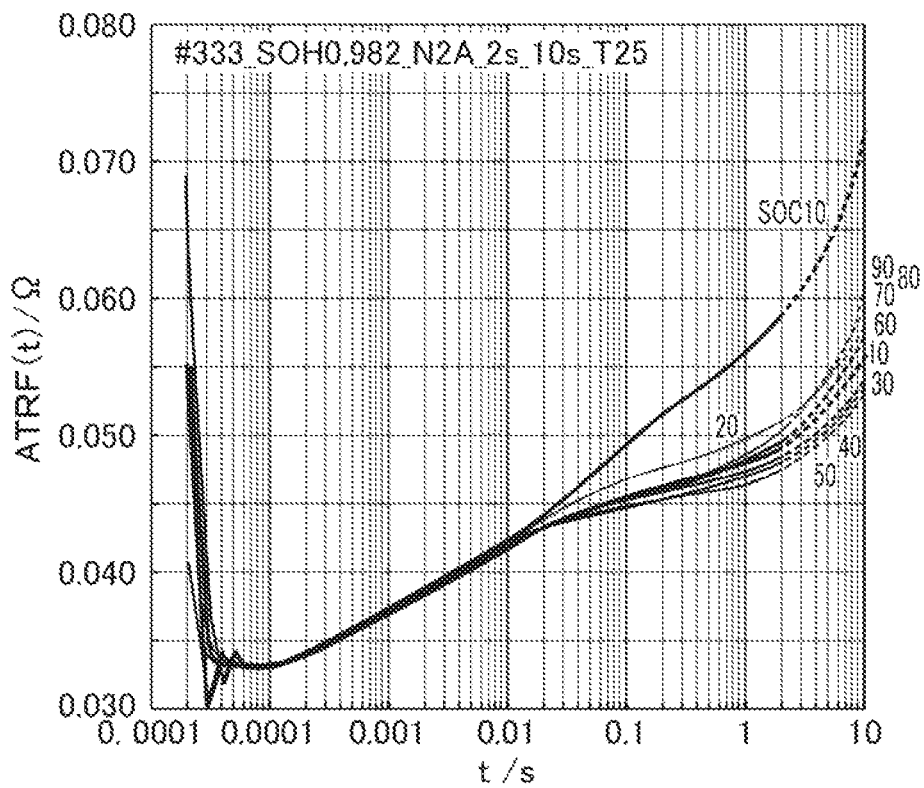
FIG. 10(a) and FIG. 10(b) are diagrams illustrating examples of the SOC dependence of ATRF(t). The horizontal axis in FIG. 10(a) represents t/s and the horizontal axis in FIG. 10(b) represents $t^{1/2}/s^{1/2}$.
Figure 10B:
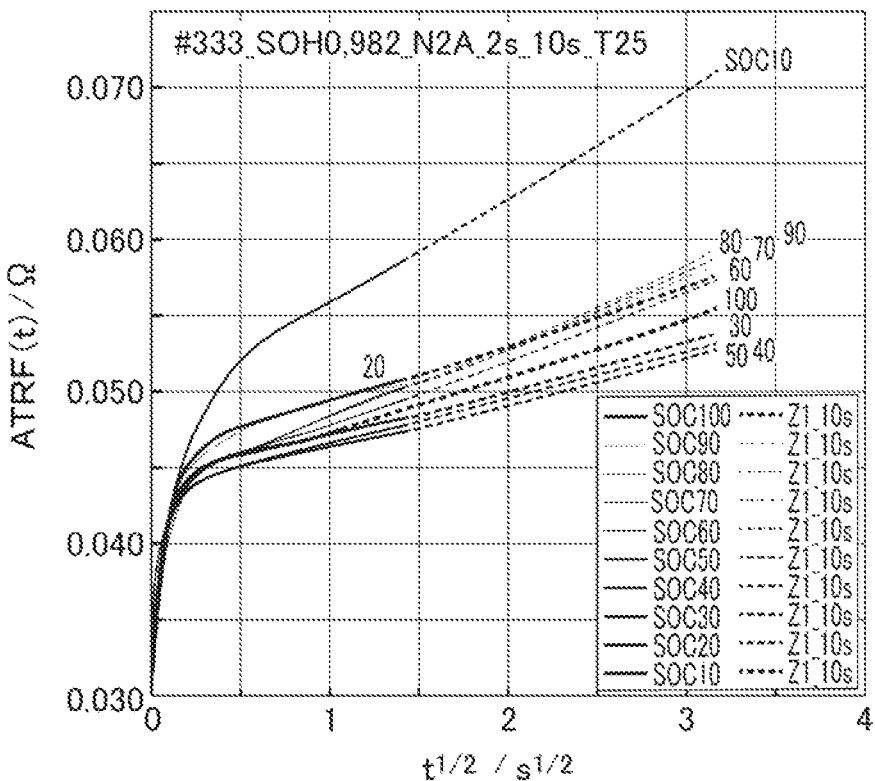

For the 18650-type LIB indicated by cell number 1 in Table 3, some of the results of analysis of batteries of this type for which the degradation patterns are different are described below. FIG. 9 illustrates a case where CP transient responses were successively measured with the applied pulse widths of 0.2 seconds to 10 seconds and the wave height of 2 A, and resulting ATRF(t) plots were analyzed and presented on the same ATRF(t) vs. log(t) axis graph. It was found that the measurement results of the both that differ in pulse width by ten times completely matched. From this, it was discovered that the apparent transient resistance function (ATRF(t)) analysis is effective. That is, it was found that various parameter values obtained as a result of analysis of the responses have the same values regardless of the pulse width. FIG. 10 illustrates the SOC dependence of the ATRF(t) plot of the LIB illustrated in FIG. 9. It was found that in the measurement target battery, the ATRF(t) curve significantly changes when the SOC is 0.25 or less.

FIG. 9 illustrates a plot of ATRF(t) relative to log(t) obtained when successive measurement is performed with a constant wave height (−2.00 A) while the pulse width of the applied current is changed. Measurement was performed with the wave height −2 A, the pulse width; (a) 0.2 s, 0.5 s, (c) 1 s, (d) 2 s, (e) 5 s, and (f) 10 s, and at 25° C. (18650 LIB (2200 mAh), SOH=0.982, SOC=50%).

FIG. 10 illustrates the SOC dependence of ATRF(t). Measurement was performed with the wave height −2 A, the pulse width (2 s and 10 s), and at 25° C. (18650 LIB (2200 mAh), SOH=0.982, and SOC=50%).

Embodiment 6

Accumulation of Time-Series Data of Battery Characteristics Having Different Degradation Pattern Histories Test target batteries are exposed to various environments (cyclically used in charge and discharge at a high temperature and a low temperature, cyclically used in charge and discharge at a high rate, and left) to induce degradation of the charge-discharge characteristics and measure the TDRF (t) characteristics of the respective batteries under such conditions with the temperature and SOC conditions illustrated in FIG. 11 to create a database (DB).

FIG. 11 illustrates creation of a database regarding the dependence of ATRF(t) on the SOC and temperature, and a file of degradation states (SOH) is created. Further, a file of a database of equivalent circuit parameter values obtained by analyzing ATRF(t) is created. Therefore, with measurement in the degradation states (for example, measurement in at least six states, the number of measurement points of a single battery is 2394 (=19 (temp)×21 (SOC)×6 (SOH)). To check reproducibility (for example, at least four cells), it is understood that the number of pieces of measurement data is 9576.

In FIG. 12, (a) is a diagram illustrating a constant-current pulse applied to a battery and a chronopotentiogram (CP) response thereto, (b) is a diagram illustrating conversion of the CP response to a normalized curve (ATRF(t)), and (c) is a diagram illustrating an example Nyquist plot created by using equivalent circuit parameter values obtained as a result of a simulation analysis of ATRF(t). Note that response areas I to V illustrated in (a) and (b) represent main contribution of the equivalent circuit parameters illustrated in FIG. 13 to the CP response.

FIG. 13 illustrates equivalent circuit modeling (ECM) of an overall electrode reaction mechanism for a battery used in an analysis of the chronopotentiogram (CP). Note that here, a technique called CPE (constant phase element) is not used in fitting.

As an equivalent circuit model necessary for an analysis, a circuit in which a plurality of RC parallel circuit blocks is coupled to the resistor R and the inductance L is assumed so as to correspond to the electrolyte, positive electrode, and negative electrode element factors of a lithium-ion battery (LIB). A simulation analysis using the pseudo equivalent circuit (abbreviated expression; $<R_0\_RnCn(n=2$ to $5)\_L_1R_1\_C_{int}R_{int}>$) in which two to six parallel circuits of R and C illustrated in FIG. 13 are coupled is performed with and without CPE.

Although the evaluation results are omitted, in a case where the equivalent circuit model includes two or three RC parallel circuits (n=2 or 3), it was not possible to fit the simulation curve with a curve of the actually measured values when CPE is not used; however, in a case of four parallel circuits (n=4), satisfactory fitting was possible regardless of use of CPE. As a result, it was concluded that when a model in which four parallel circuits are coupled is applied, a degradation diagnosis could be satisfactorily made even in a case where a CPE (constant phase element) parameter is not used.

FIG. 14(a1), FIG. 14(a2), FIG. 14(b1), FIG. 14(b2), FIG. 14(c1), FIG. 14(c2), FIG. 14(d1), and FIG. 14(d2) illustrate the dependence on the number of RC stages (n), of a Nyquist plot obtained from a parameter evaluation using the equivalent circuit model $<R_0\_RnCn(n=2$ to $5)\_L_1R_1\_C_{int}R_{int}>$. The diagrams in the upper rows illustrate the results of plotting (+ signs) from actual measurement data obtained as a result of measurement of the alternating-current impedance and fitting curves of the plots, and those in the lower rows illustrate simulation curves using parameter values obtained by an equivalent circuit analysis of ATRF(t) (pulse measurement conditions; current; 1.00 A, application time; 2.00 seconds). Note that the curves represented by + signs in the lower rows are the same as the curves represented by + signs in the upper rows and are illustrated fora comparison. The measured cell; the 18650-type LIB (2200 mAh), SOH=0.953, SOC=50%, measurement temperature 25° C.

As is evident from FIG. 14(a1), FIG. 14(a2), FIG. 14(b1), FIG. 14(b2), FIG. 14(c1), FIG. 14(c2), FIG. 14(d1), and FIG. 14(d2), the Nyquist plots obtained from the alternating-current impedance and those from the CP response exhibited relatively good matching in the arc portion. Here, it was found that for a pseudo equivalent circuit optimum for an analysis of a behavior of voltage changes at high and medium frequencies, n of RCn is 4 or 5. However, it was found that in measurement of the both, some of the circuit parameter factors differ in resistance value and capacitor value. Specifically, for R0, a difference was observed between the result from the alternating-current impedance measurement and the result from the CP response. In general, an inductive behavior at a high frequency is caused by the cell main body, setting up of the measurement system, and the cable connections. It is understood that the ohm resistor R0 substantially corresponds to the point of intersection with the X axis. However, in a contact process between the cathode or anode and the charge collector and between particles in a high-frequency range, inductance of a contact loss occurring at the same frequency is superimposed, and therefore, it is difficult to identify true R0. Here, for an inductive behavior in a high-frequency range, a parallel circuit formed of the inductance L1 and the resistor R1 was used.

Regarding an equivalent circuit fitting analysis for an ATRF(t) plot obtained by normalizing the CP response, an example of the result of analysis of the LIB cell having sample number 1 is illustrated in FIG. 15.

Equivalent circuit parameter fitting for the ATRF(t) plot is illustrated. The equivalent circuit model <$R_0$_RnCn(n=2 to 5)_$L_1R_1$_$C_{int}R_{int}$> used in an evaluation is as illustrated in FIG. 14, and the resulting dependence of parameter fitting on n of RnCn (n=2 (the left side in the upper row), n=3 (the right side in the upper row), n=4 (the left side in the lower row), and n=5 (the right side in the lower row)) is illustrated. Here, the simulation curves and the results of the actual measurement ATRF(t) plots are illustrated. (Measurement conditions: 18650-type LIB (2200 mA), SOH=0.953, SOC=50%, measurement temperature 25° C., pulse width 2 s, wave height −1 A, samplin rate 50 kS/s).

It was found that an optimum pseudo equivalent circuit for the ATRF(t) plot has four or five parallel circuits (n=4 or 5). Here, the results of fitting for the analysis expression expressed by Math. 6 are represented by red curves. The root mean square error (RMSE) at this time was $1.35 \times 10^{-4}$ (in a case of n=5).

When equivalent circuit parameters obtained at that time were compared, some of the equivalent circuit parameter factors differed in resistance value and capacitor value in both the measurement methods. It is inferred that this is caused by the principles of the measurement methods. That is, in the frequency-sweep-type alternating-current method, an application external signal for the current or the voltage generally has an ±amplitude, and for information regarding the electrode reaction, the impedance characteristics are observed from a relaxation phenomenon in the steady state of the reaction. On the other hand, in the direct-current pulse method, for information regarding the electrode reaction, impedance information is observed from a propelling phenomenon in one direction (the charge or discharge direction) of the electrode reaction or from a relaxation phenomenon toward opening in a case of shut-down. Therefore, the observation sensitivities for W6, $C_{int}$, L1, and R0 overlapping with the observation time period of the RnCn parameter differ between the methods, and a generated heat behavior inside the battery differs depending on the strength, width, and form of the external signal. It can be inferred that these affected the value of the RnCn parameter.

Note that in the fitting of the normalized curves of the pulse transient response in FIG. 15, the value of E0 was obtained from the value immediately before pulse application, that is, from the approximate value of linearity in a pre-trigger 500-point section.

Embodiment 7

Temperature Dependence of ATRF(t) of Degraded Battery

Figure 16A:
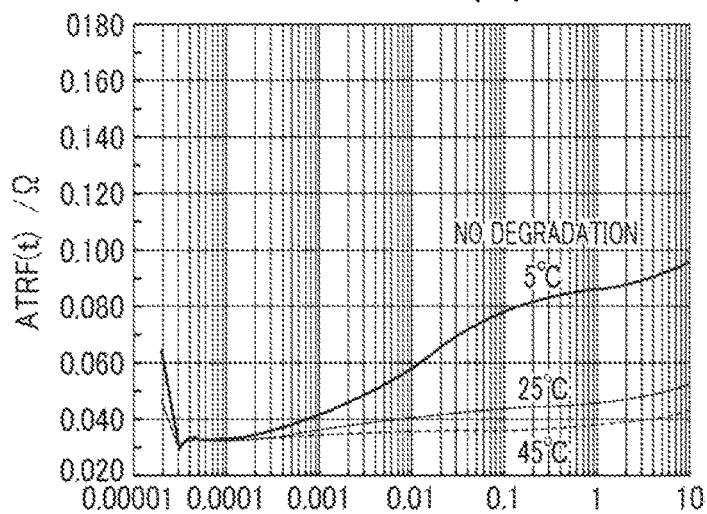
FIG. 16(a), FIG. 16(b), and FIG. 16(c) are diagrams illustrating, for example, examples of the temperature dependence (5 to 45° C.) of a CP transient response analysis ATRF(t) term parameter and the SOH dependence thereof for an LIB having an SOH use temperature history (FIG. 16(a) no degradation, FIG. 16(b) low-temperature degradation, FIG. 16(c) high-temperature degradation).
Figure 16B:
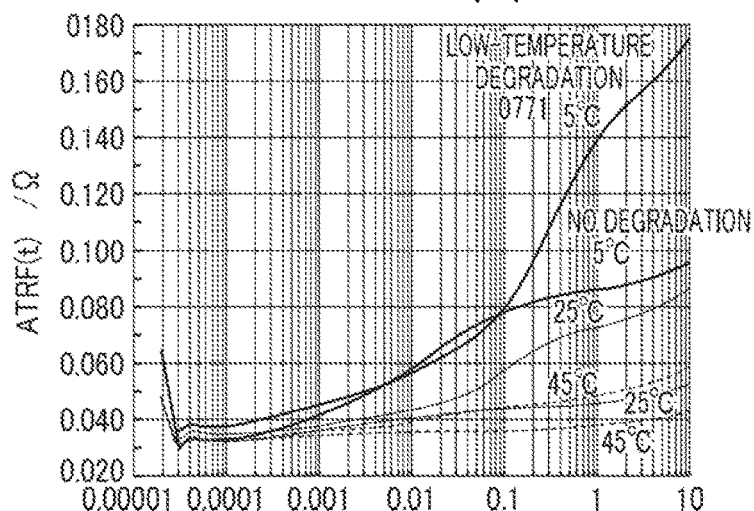
Figure 16C:
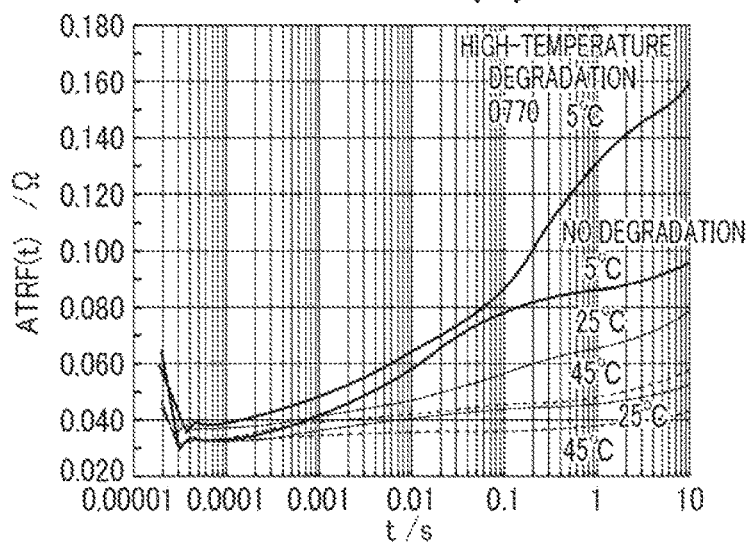

FIG. 16 illustrates, for the LIB having sample number 1 in Table 3, the temperature dependence (5, 25 and 45° C.) of ATRF(t) term curves obtained for a battery that is not yet degraded, a battery that is cycle-history degraded by a low temperature by about 25%, and a battery that is cycle-history degraded by a high temperature by about 25%. It is obvious from the diagrams that the shape of the ATRF(t) curve for each temperature differs depending on the difference in the degradation history. It is found that the difference is significant specifically at a low temperature. For ATRF(t) obtained from the battery that is cycle-history degraded by a lower temperature and that obtained from the battery that is cycle-history degraded by a high temperature, their response curves are significantly different even the temperature at the time of measurement is the same. For this, an equivalent circuit analysis was performed, and differences were found in the temperature dependence of various parameter values, such as W6, $C_{int}$, and $R_0$ as a result of the analysis. The results are omitted here.

Note that the results are served as data that indicates the possibility of a state diagnosis of battery characteristics based on a machine learning method using a DB of the temperature dependence of ATRF(t), specifically, the possibility of temperature estimation. The results of performed estimation will be described below.

FIG. 16 illustrates the temperature dependence (5 to 45° C.) of the CP transient response analysis ATRF(t) term parameter and the SOH dependence of an LIB having an SOH use temperature history (not degraded (left side), degraded by a low temperature (center), and degraded by a high temperature (right side)). (The degree of degradation of the LIB (2200 mAh) degraded by a high temperature and that of the LIB (2200 mAh) degraded by a low temperature are the same for SOH=0.77. The measurement temperature 5, 25, and 45° C., the pulse width 1 s and 10 s, the wave height −2 A).

Embodiment 8

SOC Dependence of ATRF(t)

Figure 17:
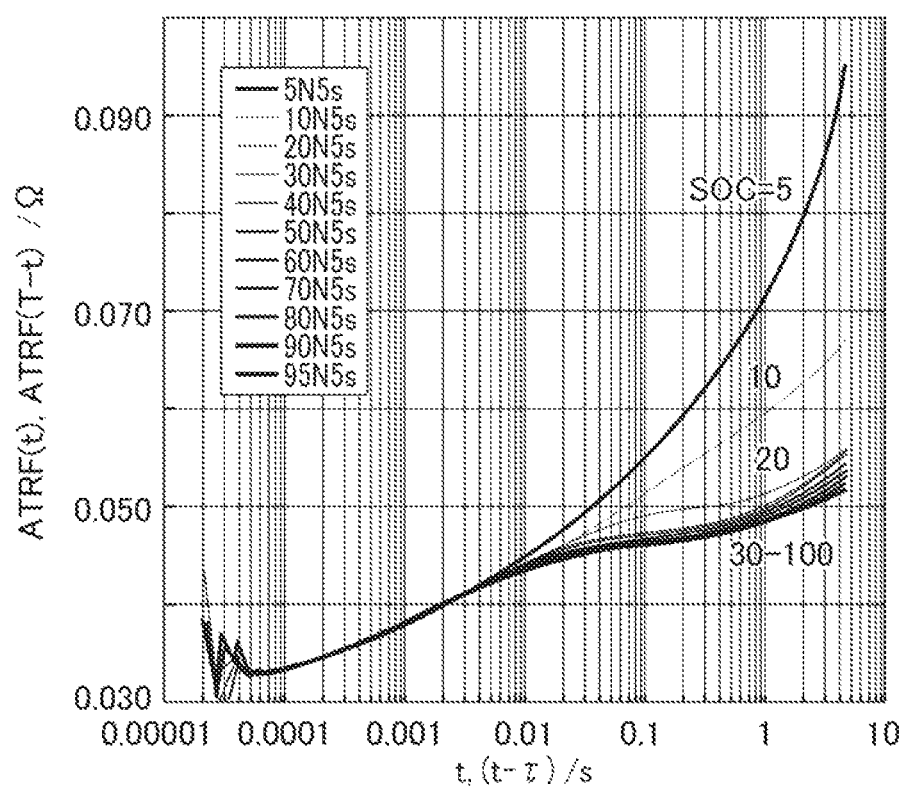
FIG. 17 is a diagram illustrating SOC dependence characteristics of ATRF(t) regarding an LIB having sample number 1 in Table 3.

FIG. 17 illustrates, for the LIB having sample number 1 in Table 3, the dependence characteristics of ATRF(t) for the SOC of 5 to 100%. In the diagram, the SOC dependence of ATRF(t) increases when the SOC is 25% or less, and the difference is significant specifically in a time period of 10 milliseconds or longer, and therefore, it is found that the temperature dependence of an equivalent circuit parameter that responds in this time constant range increases.

Note that the results are served as data that indicates the possibility of a state diagnosis of battery characteristics based on a machine learning method using a DB of the SOC dependence of ATRF(t), specifically, the possibility of SOC estimation. The results of performed estimation will be described below.

FIG. 17 illustrates the SOC dependence characteristics of ATRF(t). (18650-type LIB (2200 mAh), SOH=0.983, SOC=5 to 100%, measurement temperature 25° C., pulse width 5 s, wave height −2 A)

Embodiment 9

Learning Software for Correlation Model for Equivalent Circuit Parameters and for SOH, and SOH Estimation In estimation of, for example, an SOH factor of a battery state according to the technique of the present invention, a kernel model of a machine learning method is used as an input vector, for (1) a case where a database (DB) of the impedance characteristics is used, (2) a case where a DB of equivalent circuit parameters calculated from the impedance characteristics is used, (3) a case where a normalized database (DB) of chronopotentiogram (CP) characteristics obtained using a pulse method is used, and (4) a case where a DB of equivalent circuit parameters calculated from the normalized data is used, the results from the respective cases are studied, and a state evaluation method for, for example, the degree of degradation that is optimum and practical for the high-speed pulse method is selected.

Here, a correlation model for equivalent circuit parameters obtained by analysis and evaluation and for battery characteristics state factors, such as the SOH, is built, and the value of a factor, such as the SOH, is estimated from the model. In an estimation program, a kernel model is used as the correlation model. First, equivalent circuit parameters obtained as a result of analysis and the temperature at the time of measurement are assumed as input to the kernel model, the SOH is assumed as output, and supervised learning is performed. The kernel model is linear relative to a parameter to be obtained, and therefore, the solution is analytically obtained by using the least squares method. The mathematical expression of the kernel model and the computational expression of learning are separately described in Math. 8 to Math. 15. In the above description, the present invention was applied to the LIBs illustrated in Table 3 and was studied. For battery systems having different component materials, a state diagnosis of the characteristics was made, and the results were obtained with substantially the same estimation accuracy. Examples of the results will be illustrated one by one in the following embodiments. In this estimation method, the root mean square error (RMSE) of an estimation factor is calculated to determine the validity of the technique. Here, a reference value based on which this technique is applied or selected is an RMSE of 0.05 or less. The evaluation results are summarized in Table 5.

TABLE 5

| Diagnosis time-series data/ Excluded parameter terms | Mean value | Minimum value | Maximum value |
| --- | --- | --- | --- |
| Normalized raw data | 0.014 | 0.003 | 0.067 |
| Equivalent circuit parameters/None | 0.058 | 0.016 | 0.119 |
| Equivalent circuit parameters/$W_6$ | 0.048 | 0.014 | 0.109 |
| Equivalent circuit parameters/$W_6$, $C_{int}$, $R_{int}$ | 0.047 | 0.012 | 0.107 |

Embodiment 10

Learning Software for Correlation Model for Measurement Raw Data and for SOH, and SOH Value Estimation In estimation of, for example, the SOH factor of a battery state by using the technique of the present invention, a correlation model for CP raw data for pulses obtained in an experiment (time-series data after down-sampling) and corresponding normalized data of the CP raw data and for the SOH is built, and the SOH is estimated from the model. In an estimation program, a kernel model is used as the correlation model as in the case of using the DB of equivalent circuit parameters. The raw data and the temperature at the time of measurement are assumed as input to the kernel model, the SOH is assumed as output, and supervised learning is performed. The kernel model is linear relative to a parameter to be obtained, and therefore, the solution is analytically obtained by using the least squares method. The CP raw data used here is time-series data obtained by performing down-sampling processing, smoothing processing, and normalization processing for the measurement data as described above. However, in a case where down-sampling processing is performed for raw data and normalized data and where pieces of time-series data obtained as a result of the down-sampling processing are used, the sampling times of the respective pieces of data need to be synchronized. For this, in this program, the sampling times of the pieces of data are synchronized by using a smoothing spline interpolation method.

Examples of the results of studies of Embodiments 9 and 10 of the present invention are illustrated (see Table 5). The examples are the results of estimation of the SOH value for the LIB having sample number 1 in Table 3. The RMSE in this case was calculated. As a result, the RMSEs, which are the root mean square errors, were 0.014 and 0.047 for estimation from the normalized data and for estimation from the analysis circuit parameters respectively. It can be concluded that a technique for enabling a degradation diagnosis of the SOH of a battery with an estimation precision of within 5% (the diagnosis time is within two seconds) has been established.

Table 5 illustrates RMSEs of machine-learning-based SOH estimation in which normalized raw data of a normalized function curve (ATRF(t)) of a pulse response CP (at the time of current application) and parameter values of the pseudo equivalent circuit model <$R_{0\_}$ $RnCn(n=4)\_W_6\_L_1R_1\_C_{int}R_{int}$> obtained as a result of analysis of the normalized raw data are used as time-series data (50 micros to 0.5 s, 90 pieces of data are generated at regular intervals on a logarithmic scale, temperature data not used as input, changes in the mean value/minimum value/maximum value of RMSE when estimation is performed three times, 18650 LIB; having a history of high-temperature degradation and low-temperature degradation with SOH: 1.00 to 0.60, temperature: 5 to 45° C., the total number of pieces of data 235; the number of pieces of learning data 117 and the number of pieces of evaluation data 118).

Embodiment 11

SOH estimation in which pulse responses measured at the time of current application and at the time of current interruption are used as time-series data The potential hysteresis phenomenon that represents a change in the OCV value in a case where a current pulse is repeated in the charge and discharge directions and after repeated application in one direction has been described with reference to FIG. 6. In this technique, in order to avoid the influence of the potential hysteresis phenomenon, in CP measurement, a form in which a current pulse is applied in one direction to perform CP measurement and a form in which CP measurement is performed at the time of pulse current interruption have been employed. The validity was checked with obtained ATRF(t) curves, and time-series data of the curves was used to perform machine-learning-based SOH estimation. Examples of the results of a study of the SOH estimation are illustrated in Table 6. The examples are the results of estimation of the SOH value for the LIB having sample number 1 in Table 3. The RMSE in this case was calculated. As a result, the RMSEs, which are the root mean square errors, were 0.011 and 0.015 for estimation from the raw data at the time of current application and at the time of current interruption respectively. It can be concluded that with the both forms, a technique for enabling a degradation diagnosis of the SOH of a battery with an estimation precision of within 2% (the diagnosis time is within one second) has been established. Here, the normalized raw data is assumed as input to the kernel model. The results of supervised learning in which the SOH is output were the same regardless of whether or not the temperature at the time of measurement is added as input to the kernel model.

Table 6 illustrates RMSEs of machine-learning-based SOH estimation in which time-series data obtained by normalizing pulse response CPs (at the time of current application and at the time of current interruption) is used (50 micros to 0.5 s, 100 pieces of data are generated at regular intervals on a logarithmic scale, temperature data not used as input, 18650 LIB; having a history of high-temperature degradation and low-temperature degradation with SOH: 1.00 to 0.60, temperature: 5 to 45° C., the total number of pieces of data 347×2; the number of pieces of learning data 173×2 and the number of pieces of evaluation data 174×2).

TABLE 6

| Applied area | Mean | Minimum value | Maximum value |
|---|---|---|---|
| Current application | 0.011 | 0.007 | 0.025 |
| Current interruption | 0.015 | 0.010 | 0.027 |

Embodiment 12

Dependence of SOH Estimation Value on the Number of Pieces of Time-Series Data of Pulse Response (PC)

Table 7 illustrates the results of examining influences on the SOH estimation value when the total number of pieces of data is fixed to 347 and the ratio between the number of pieces of evaluation data and the number of pieces of learning data is changed.

TABLE 7

| Learning:Evaluation | Mean value | Minimum value | Maximum value |
|---|---|---|---|
| 5:5 (173/174) | 0.011 | 0.007 | 0.027 |
| 4:6 (138/209) | 0.016 | 0.011 | 0.026 |
| 3:7 (104/243) | 0.016 | 0.012 | 0.029 |
| 2:8 (69/278) | 0.020 | 0.013 | 0.061 |

From the results, it can be determined that the number of pieces of learning data is desirably 100 or more.

Table 7 illustrates RMSEs of machine-learning-based SOH estimation in which time-series data obtained by normalizing a pulse response CP (at the time of current interruption) is used (50 micro to 0.5 s, 100 pieces of data are generated at regular intervals on a logarithmic scale, temperature data not used as input, when the total number of pieces of data is fixed to 347, and the ratio between the number of pieces of evaluation data and the number of pieces of learning data is changed, changes in the mean value/minimum value/maximum value of RMSE when estimation is performed three times, 18650 LIB; having a history of high-temperature degradation and low-temperature degradation with SOH: 1.00 to 0.60, temperature: 5 to 45° C.).

Embodiment 13

Learning software for correlation model for measured raw data and for temperature, and estimation of temperature at the time of measurement An object of this function is to build a correlation model for normalized raw data of a CP of a pulse obtained in an experiment and for the temperature at the time of measurement and to estimate the temperature at the time of measurement from the model. In this estimation program, a kernel model is used as the correlation model. The normalized raw data and the temperature at the time of measurement are assumed as input to the kernel model, the temperature at the time of measurement is assumed as output, and supervised learning is performed. Examples of the temperature dependence characteristics of ATRF(t) of a CP transient response are already illustrated in FIG. 16.

Table 8 illustrates examples of the results of a study of estimation of the temperature at the time of warm measurement. Here, here, the examples are the results of estimation of the SOH value for the LIB having sample number 1 in Table 3. The RMSE in this case was calculated. As a result, the RMSE error was 1.0° C. when expressed as a temperature. An example of the error distribution of temperature estimation is illustrated in FIG. 18(b). It can be concluded that a technique for enabling a temperature diagnosis in which the temperature at the time of measurement of a battery for which the temperature at the time of measurement is 5 to 45° C. can be diagnosed with an estimation precision of within 4% (the diagnosis time is within one second) has been established. Here, as time-series data, 50 micros to 1 s/0.5 s, 100 pieces of data were generated at regular intervals on a logarithmic scale and used. From Table 8, it is found that the estimation accuracy increases as the number of pieces of learning increases. In this embodiment, as the time-series data, the ATRF(t) dependence at five points of temperature (5.0, 15.0, 25.0, 35.0, and 45.0° C.) is used in a DB, and it is expected that the estimation accuracy increases as the number of temperature variables increases.

TABLE 8

| Learning:Evaluation | Mean value (° C.) | Minimum value (° C.) | Maximum value (° C.) |
|---|---|---|---|
| 5:5 (173/174) | 1.00 | 0.70 | 2.06 |
| 4:6 (138/209) | 1.68 | 0.97 | 4.44 |
| 3:7 (104/243) | 1.97 | 1.22 | 6.01 |
| 2:8 (69/278) | 2.94 | 1.46 | 15.4 |

Table 8(a), FIG. 8(b), and FIG. 8(c) illustrate RMSEs of machine-learning-based temperature estimation in which time-series data obtained by normalizing a pulse response CP (at the time of current interruption) is used (50 micros to 0.5 s, 100 pieces of data are generated at regular intervals on a logarithmic scale, temperature data not used as input, when the total number of pieces of data is fixed to 347, and the ratio between the number of pieces of evaluation data and the number of pieces of learning data is changed, changes in the mean value/minimum value/maximum value of RMSE when estimation is performed three times, 18650 LIB; having a history of high-temperature degradation and low-temperature degradation with SOH: 1.00 to 0.60, temperature: 5 to 45° C.).

Embodiment 14

Learning Software for Correlation Model for Measurement Raw Data and for SOH and Temperature, and Simultaneous Estimation of SOH Value and Temperature In the pulse diagnosis method of the present invention, multiple-output (SOH, temperature, and SOC) estimation can be simultaneously performed. An object of this function is to build a correlation model for normalized raw data of a CP of a pulse obtained in an experiment (time-series data after down-sampling) and for the SOH and the temperature at the time of measurement and to estimate the SOH and the temperature at the time of measurement from the model. In this estimation program, a kernel model is used as the correlation model. The normalized raw data and the temperature at the time of measurement are assumed as input to the kernel model, the SOH and the temperature at the time of measurement are assumed as output, and supervised learning is performed. The kernel model is linear relative to a parameter to be obtained, and therefore, the solution is analytically obtained by using the least squares method. Here, the results of estimation of the SOH value and the temperature of the LIB having sample number 1 in Table 3 are obtained. The RMSE in this case was calculated.

As a result, the RMSEs, which are the root mean square errors, for the respective estimation factors were 0.011 and 1.0° C. respectively. It can be concluded that a technique for enabling a degradation diagnosis in which the SOH of a battery can be diagnosed with an estimation precision of within 1.1% and the temperature thereof can be diagnosed with an estimation precision of 1.0° C. (within 4%, the diagnosis time is within one second) has been established.

TABLE 9

| Learning:Evaluation | SOH mean value | Temperature mean value (° C.) |
|---|---|---|
| 5:5 (173/174) | 0.011 | 1.00 |

Table 9 illustrates RMSEs of machine-learning-based simultaneous estimation of the SOH value and the temperature in which time-series data obtained by normalizing a pulse response CP (at the time of current interruption) is used (50 micros to 0.5 s, 100 pieces of data are generated at regular intervals on a logarithmic scale, temperature data not used as input, when the total number of pieces of data is fixed to 347, and the ratio between the number of pieces of evaluation data and the number of pieces of learning data is changed, changes in the mean value/minimum value/maximum value of RMSE when estimation is performed three times, 18650 LIB; having a history of high-temperature degradation and low-temperature degradation with SOH: 1.00 to 0.600, temperature: 5 to 45° C.).

Embodiment 15

Learning software for correlation model for measurement raw data and for SOC, and SOC estimation An object of this function is to build a correlation model for normalized raw data of a CP of a pulse obtained in an experiment (time-series data after down-sampling, see FIG. 16) and for the SOC and to estimate the SOC from the model. In this program, a kernel model is used as the correlation model. The normalized raw data and the temperature at the time of measurement are assumed as input to the kernel model, the SOC is assumed as output, and supervised learning is performed. FIG. 17 illustrates an example of the SOC dependence characteristics of ATRF(t) of a CP transient response, and it is found that the SOC dependence characteristics of the battery are significant when the SOC is 30% or less.

Examples of the results of a study of SOC estimation of this embodiment are illustrated (see Table 10). Here, the SOC of the LIB having sample number 1 in Table 3 was estimated, and the RMSE in this case was calculated. As a result, the RMSE, which is the root mean square error, was 0.030 when SOC=0.25 or less. It can be concluded that a technique for enabling a degradation diagnosis of the SOC of a battery with an estimation precision of within 3% (the diagnosis time is within one second) has been established.

TABLE 10

| Learning:Evaluation | SOC mean value (for 0.25 or less) | SOC mean value (for 0.25 or more) |
|---|---|---|
| 5:5 (173/174) | 0.03 | 0.15 |

Table 10 illustrates RMSEs of machine-learning-based estimation of the SOC value in which time-series data obtained by normalizing a pulse response CP (at the time of current interruption) is used (50 micros to 0.5 s, 100 pieces of data are generated at regular intervals on a logarithmic scale, temperature data not used as input, when the total number of pieces of data is fixed to 347, the number of pieces of evaluation data is 173, and the number of pieces of learning data is 174, changes in the mean value/minimum value/maximum value of RMSE when estimation is performed three times, 18650 LIB; having a history of high-temperature degradation and low-temperature degradation with SOH: 1.00 to 0.600, temperature: 5 to 45° C.).

Embodiment 16

Evaluation of Error of SOH Value Estimation from Measurement Raw Data

Figure 18A:
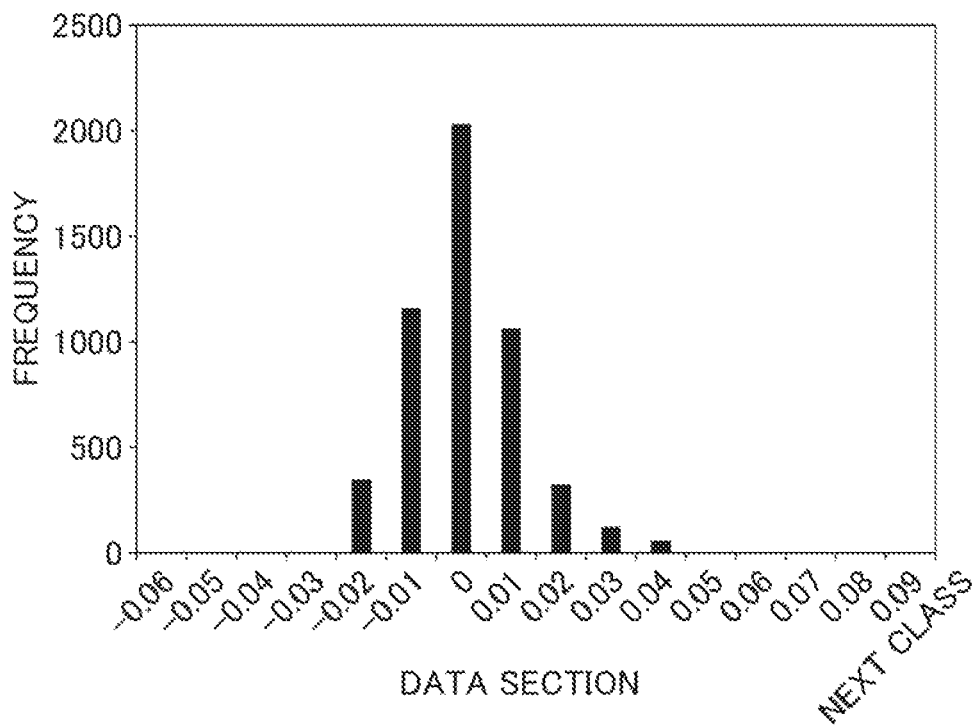
FIG. 18(a) is a diagram illustrating an example error distribution of machine-learning-based SOH estimation in which normalized raw data of a normalized curve (ATRF(t)) of a pulse response CP (at the time of current application) illustrated in Table 4 is used as time-series data.
Figure 18B:
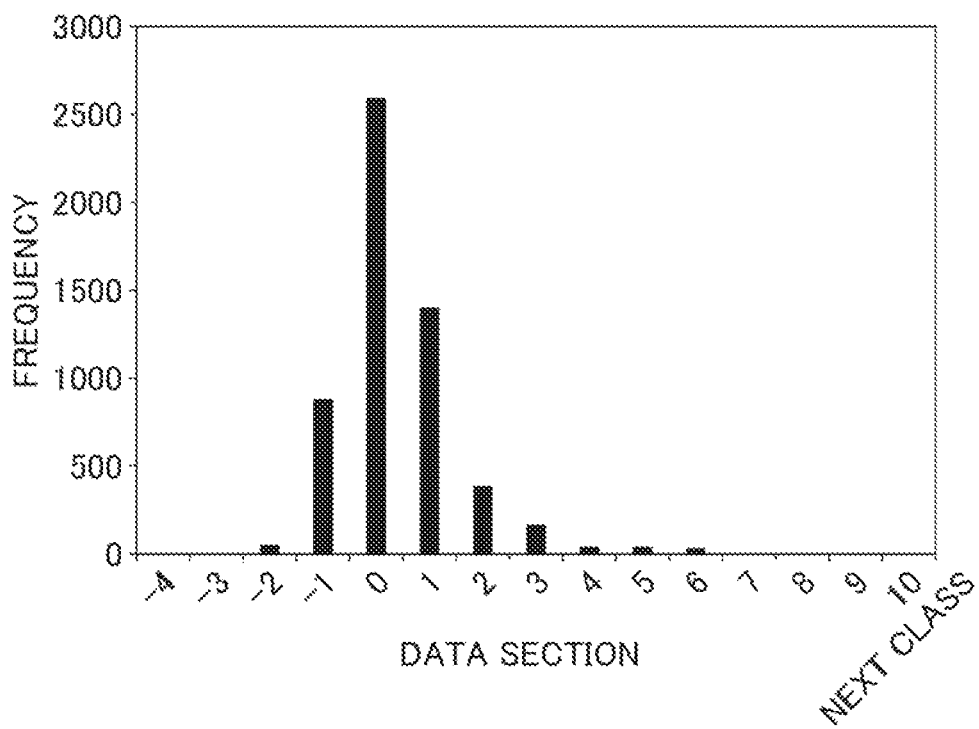
FIG. 18(b) is a diagram illustrating an example error distribution of machine-learning-based temperature estimation in which normalized raw data of a normalized curve (ATRF(t)) of a pulse response CP (at the time of current application) illustrated in Table 6 is used as time-series data.

FIG. 18(a) illustrates an error distribution of machine learning-based SOH estimation in which normalized raw data of a normalized curve (ATRF(t)) of a pulse response CP (at the time of current application) illustrated in Table 6 is used as time-series data (50 micros to 0.1 s, 100 pieces of data are generated at regular intervals on a logarithmic scale, temperature data not used as input, when estimation is performed three times, 18650 LIB; having a history of high-temperature degradation and low-temperature degradation with SOH: 1.00 to 0.60, temperature: 5 to 45° C., the total number of pieces of data 347; the number of pieces of learning data 173 and the number of pieces of evaluation data 174).

Embodiment 17

Evaluation of Error of Temperature Estimation from Measurement Raw Data

FIG. 18(b) illustrates an error distribution of machine learning-based temperature estimation in which normalized raw data of a normalized curve (ATRF(t)) of a pulse response CP (at the time of current application) illustrated in Table 8 is used as time-series data (50 micros to 0.1 s, 100 pieces of data are generated at regular intervals on a logarithmic scale, temperature data not used as input, when estimation is performed three times, 18650 LIB; having a history of high-temperature degradation and low-temperature degradation with SOH: 1.00 to 0.60, temperature: 5 to 45° C., the total number of pieces of data 347; the number of pieces of learning data 173 and the number of pieces of evaluation data 174).

Embodiment 18

From charge and discharge capacity curves at a low rate (for example, 0.1 C rate), the ratio of (full charge capacity/ initial full charge capacity) is obtained. The ratio has been considered to be an indicator (SOH) that indicates the state of health of a battery. Regarding this ratio, the ratio of (full charge capacity/initial full charge capacity) calculated from charge and discharge curves at a medium to high rate (for example, 0.5 to 3 C rate) can be used as an indicator indicating a decrease in the power density (SOP).

Figure 21:
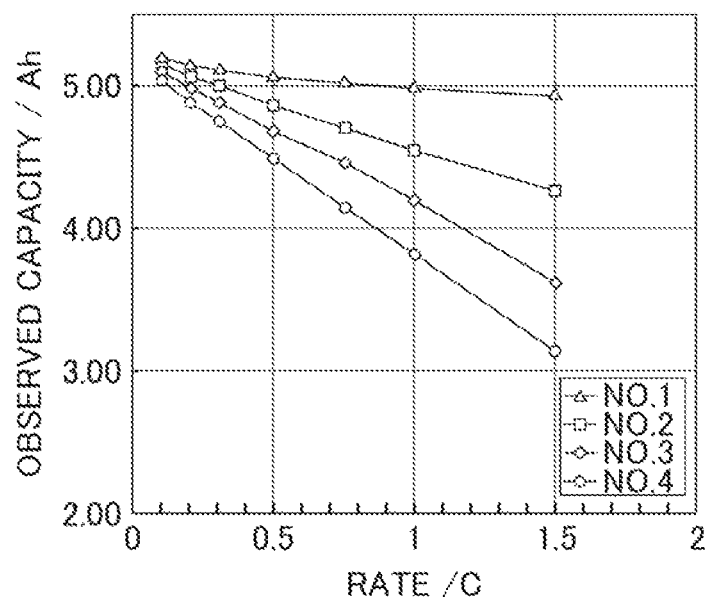
FIG. 21 illustrates the dependence of the discharge capacity (observed capacity) on the charge-discharge rate value in a constant-current mode of the same value in degraded LIB batteries (initial capacity: 5.19 Ah) having a negative electrode made of hard carbon. In measurement, the end voltage of charge and that of discharge are set to 4.200 V and 2.500 V respectively.

FIG. 21 illustrates, fora plurality of LIBs (initial capacity: 5.19 Ah) that is used as onboard batteries and that has a negative electrode made of hard carbon, changes in the discharge capacity (observed capacity) relative to the charge-discharge rate value in a constant-current mode of the same value, in the respective batteries for which the degrees of degradation are different. Note that in measurement, the end voltage of charge and that of discharge are set to 4.200 V and 2.500 V respectively.

For these LIBs, when the discharge capacity of a non-degraded battery obtained for a 1.0 C rate was assumed to be SOP=1.0, the maximum SOP of a degraded battery was 0.76. For the LIBs, the SOH obtained with a method similar to that in Embodiment 11 was regarded as the SOP, and machine-learning-based SOP estimation was performed while a pulse response is used as time-series data. As a result of this, it was concluded that a technique for enabling a degradation diagnosis of the SOP of a battery with an estimation precision of within 2% (the diagnosis time is within one second) has been established. From the above-described results, it was found that estimation of the amount of decrease in the power density at a medium to high rate that is highly versatile, that is, estimation of the maximum value of the available amount of a battery in use when the time passes thereafter, could be performed quickly with high accuracy with this technique. This is one of the advantageous effects of the present invention.

INDUSTRIAL APPLICABILITY

As described above, the present invention can be adapted to an LIB that is being charged. For this, it is assumed that E(t) in Math. 7 has a drift component proportional to time, and ATRF(t) obtained by replacing E(t) with E(t)−βt (β is a factor of proportionality) is used.

More specifically, a linear approximate expression of voltage changes caused by charge and discharge is obtained from the time area immediately before pulse application (pre-trigger), and the approximate expression is used to correct a pulse response voltage value, thereby removing the influence of charge and discharge. Accordingly, a net value of the normalization function ATRF(t) from which the influence of charge and discharge is eliminated can be obtained.

Figure 19:
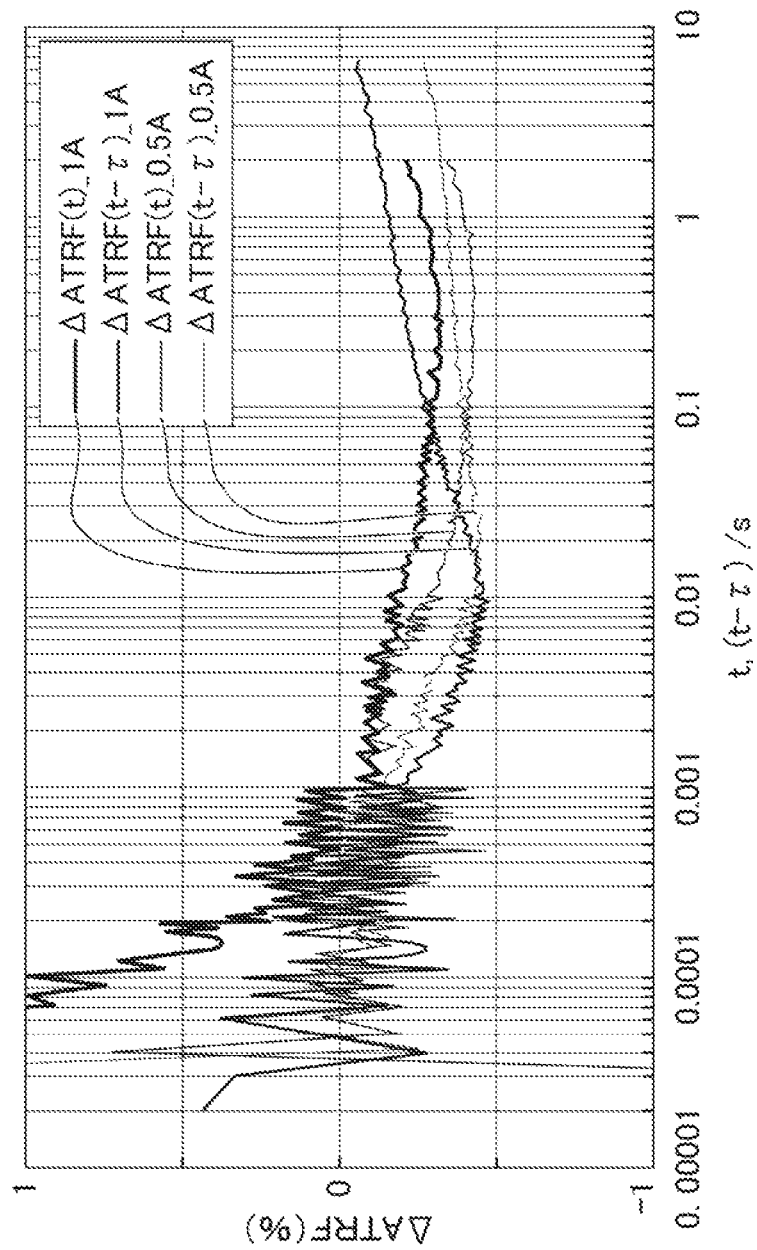
FIG. 19 illustrates an example of ATRF(t) characteristics in a case where pulse measurement is performed for an LIB that is in a charge operation, and indicates differences between an ATRF(t) curve for a pulse when charge is stopped (0 A current) and ATRF(t) curves corrected for pulses under charge currents of 1 A and 0.5 A.

FIG. 19 illustrates example ATRF(t) characteristics in a case where pulse measurement is performed for an LIB that is in a charge operation, and illustrates differences between an ATRF(t) curve for a pulse when charge is stopped (current 0 A) and corrected ATRF(t) curves for a pulse with a charge current of 1 A and 0.5 A. At the time point when the SOC exceeds 50% during charge with 1 A (equivalent to 0.5 C rate), a pulse having a wave height of 2 A and a width of 2 s was applied and a transient response was measured. Thereafter, the rate was changed to 0.5 A (equivalent to ¼ C rate), pulse measurement was similarly performed in five minutes. Thereafter, pulse measurement was also performed after an elapse of 20 minutes since a stop of charging. Pieces of measurement data obtained at the preceding two time points were corrected using the method of the present invention, a piece of measurement data obtained when charge was stopped was not corrected, and normalized curves for the respective pieces of data were created.

As illustrated in FIG. 19, it is found that the difference from the normalized curve when charge was stopped can be corrected within 0.5% throughout the pulse time. From this, it was found that the battery state could be estimated from pulse measurement during charge as in a stationary state.

Figure 20:
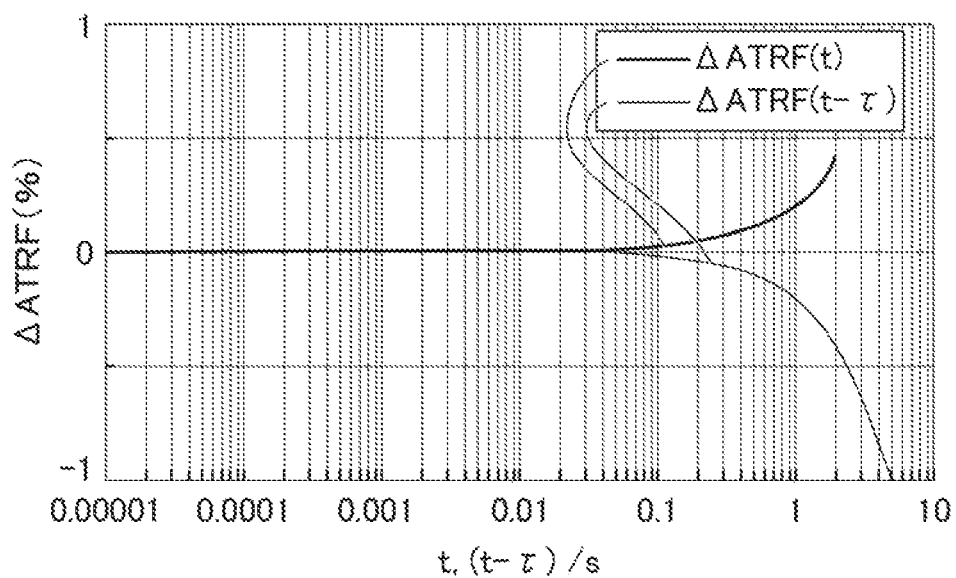
FIG. 20 illustrates an example effect of voltage correction on a normalization function of a pulse response in an LIB that is being charged, and indicates a difference (%) between the ATRF(t) values before and after correcting a voltage change caused by a charge current. The measurement conditions are as follows: the charge current 1 A, the pulse wave height 2 A, the width 2 s, the sampling rate 100 kS/s, the measurement temperature: room temperature (25° C.), the test target battery #397 (18650).

FIG. 20 illustrates an example effect of a voltage correction on a normalization function of a pulse response of an LIB that is being charged, and illustrates the difference (%) between ATRF(t) values before and after correction of a voltage change caused by a charge current. The measurement conditions are as follows: the charge current 1 A, pulse wave height 2 A, width 2 s, sampling rate 100 kS/s, measurement temperature: room temperature (25° C.), and the test target battery is #397 (18650).

In the case of FIG. 20, it is found that in measurement during charge, compensation for the effect of charge needs to be provided in the time area in which the pulse width Or the pulse time) is 0.1 s or more.

REFERENCE SIGNS LIST 1 current pulse source
2 test target battery
3 noise filter
4 voltmeter
5 digital filter
6 first data processor
7 second data processor
8 database

The invention claimed is:

1. A battery diagnosis apparatus based on a current pulse method, the battery diagnosis apparatus comprising:
    a pulse current generator that applies a single current pulse to a secondary battery that is a measurement target;
    a voltage measuring instrument that measures a voltage response made in response to application of the single current pulse;
    a first data processing device that obtains a chronopotentiogram indicating a change in the voltage response over time and performs normalization of the chronopotentiogram; and
    a second data processing device that receives data of the normalized chronopotentiogram, wherein
    the second data processing device makes a battery diagnosis in which the second data processing device estimates, from normalized data regarding the secondary battery that is a measurement target, a battery state expressing factor including a life, a temperature, or a state of health and a state of charge of the secondary battery that is a measurement target, by using a correlation between normalized data regarding a secondary battery for extracting a battery state expressing factor, the normalized data being prepared in advance, and a battery state expressing factor,
    the current pulse is a constant current pulse that is a constant current in a certain time period,
    the secondary battery that is a measurement target and the secondary battery for extracting a battery state expressing factor are made of a component material of the same composition,
    both the constant current used for the secondary battery that is a measurement target and the constant current used for the secondary battery for extracting a battery state expressing factor are in a charge direction or in a discharge direction, and the normalization is normalization in which an apparent transient resistance change function calculated from current values and transient response values of a voltage before and after pulse application is used for a transient resistance curve, and the normalized data is data for which the normalization is performed to implement a feature of suppressing an influence of a hysteresis phenomenon caused by a difference in a current pulse direction in a battery diagnosis.

2. A battery diagnosis apparatus based on a current pulse method, the battery diagnosis apparatus comprising:

a pulse current generator that applies a current pulse formed of a plurality of current pulses to a secondary battery that is a measurement target;

a voltage measuring instrument that measures a voltage response made in response to application of the current pulse;

a first data processing device that obtains a chronopotentiogram indicating a change in the voltage response over time and performs normalization of the chronopotentiogram; and a second data processing device that receives data of the normalized chronopotentiogram, wherein the second data processing device makes a battery diagnosis in which the second data processing device estimates, from normalized data regarding the secondary battery that is a measurement target, a battery state expressing factor including a life, a temperature, or a state of health and a state of charge of the secondary battery that is a measurement target, by using a correlation between normalized data regarding a secondary battery for extracting a battery state expressing factor, the normalized data being prepared in advance, and a battery state expressing factor, the current pulse is a constant current pulse that is a constant current in a certain time period, the secondary battery that is a measurement target and the secondary battery for extracting a battery state expressing factor are made of the same component material, both the constant current used for the secondary battery that is a measurement target and the constant current used for the secondary battery for extracting a battery state expressing factor are in a charge direction or in a discharge direction, and the normalization is normalization in which an apparent transient resistance change function calculated from current values and transient response values of a voltage before and after pulse application is used for a transient resistance curve, and the normalized data is data for which the normalization is performed to implement a feature of suppressing an influence of a hysteresis phenomenon caused by a difference in a current pulse direction in a battery diagnosis.

3. The battery diagnosis apparatus based on a current pulse method according to claim 1, wherein the current pulse is a current pulse that is in a charge direction of the secondary battery, has a current value that changes from a predetermined current value including zero to a predetermined constant current value, and is thereafter interrupted.

4. The battery diagnosis apparatus based on a current pulse method according to claim 2, wherein the current pulse is a current pulse that is in a charge direction of the secondary battery, has a current value that changes from a predetermined current value including zero to a predetermined constant current value, and is thereafter interrupted.

5. The battery diagnosis apparatus based on a current pulse method according to claim 1, wherein the current pulse is a current pulse that is in a discharge direction of the secondary battery, has a current value that changes from a predetermined current value including zero to a predetermined constant current value, and is thereafter interrupted.

6. The battery diagnosis apparatus based on a current pulse method according to claim 2, wherein the current pulse is a current pulse that is in a discharge direction of the secondary battery, has a current value that changes from a predetermined current value including zero to a predetermined constant current value, and is thereafter interrupted.

7. The battery diagnosis apparatus based on a current pulse method according to claim 1, further comprising: a noise filter that reduces noise in an input signal of the voltage measuring instrument; and data resampling means for reducing the number of pieces of data input to the first data processing device.

8. The battery diagnosis apparatus based on a current pulse method according to claim 1, wherein in the second data processing device, a diagnostic algorithm is installed, the diagnostic algorithm being a diagnostic algorithm for a diagnosis, in which as the correlation regarding the battery state expressing factor including the temperature of the secondary battery that is a measurement target, a correlation extracted by machine learning is used, and the second data processing device diagnoses the temperature to implement, in addition to the feature, a feature of suppressing an influence of a temperature change of a secondary battery.

9. The battery diagnosis apparatus based on a current pulse method according to claim 7, wherein in the second data processing device, a diagnostic algorithm is installed, the diagnostic algorithm being a diagnostic algorithm for a diagnosis, in which as the correlation regarding the battery state expressing factor including the temperature of the secondary battery that is a measurement target, a correlation extracted by machine learning is used, and the second data processing device diagnoses the temperature to implement, in addition to the above feature, a feature of suppressing an influence of a temperature change of a secondary battery.

10. A battery diagnosis method based on a current pulse method by using the battery diagnosis apparatus based on a current pulse method according to claim 8, wherein in extraction of the battery state expressing factor, for an operation including (A1) a step of measuring the battery state expressing factor, and (A2) a step of applying a predetermined current pulse to a secondary battery for extracting the battery state expressing factor, measuring a change in a response voltage over time obtained in response to the applying by using a voltage measuring instrument, and normalizing a series of pieces of data of a chronopotentiogram that is a result of the measuring, (A3) for a plurality of secondary batteries having different battery state expressing factors, correlations between the plurality of normalized pieces of data obtained by performing the operation including the step of A1 and the step of A2 and the plurality of battery state expressing factors are extracted by machine learning, and in a battery diagnosis, (B1) a current pulse is applied to a secondary battery that is a measurement target, (B2) a chronopotentiogram that indicates a change in a voltage response over time made in response to application of the current pulse is obtained, (B3) the chronopotentiogram is normalized, and (B4) a diagnostic algorithm using the correlations is applied to data of the normalized chronopotentiogram to estimate a battery state expressing factor to implement a feature of suppressing an influence of a hysteresis phenomenon caused by a difference in a current pulse direction in a battery diagnosis.

11. The battery diagnosis apparatus based on a current pulse method according to claim 2, further comprising: a noise filter that reduces noise in an input signal of the voltage measuring instrument; and data resampling means for reducing the number of pieces of data input to the first data processing device.

* * * * *